United States Patent
Endoh et al.

(10) Patent No.: US 8,124,484 B2
(45) Date of Patent: Feb. 28, 2012

(54) FORMING A MOS MEMORY DEVICE HAVING A DIELECTRIC FILM LAMINATE AS A CHARGE ACCUMULATION REGION

(75) Inventors: Tetsuo Endoh, Sendai (JP); Masayuki Kohno, Nirasaki (JP); Syuichiro Otao, Amagasaki (JP); Minoru Honda, Nirasaki (JP); Toshio Nakanishi, Nirasaki (JP)

(73) Assignees: Tohoku University (JP); Tokyo Electron Limited (JP)

( * ) Notice: Subject to any disclaimer, the term of this patent is extended or adjusted under 35 U.S.C. 154(b) by 0 days.

(21) Appl. No.: 12/935,792

(22) PCT Filed: Mar. 30, 2009

(86) PCT No.: PCT/JP2009/057019
§ 371 (c)(1),
(2), (4) Date: Dec. 16, 2010

(87) PCT Pub. No.: WO2009/123335
PCT Pub. Date: Oct. 8, 2009

(65) Prior Publication Data
US 2011/0086485 A1    Apr. 14, 2011

(30) Foreign Application Priority Data
Mar. 31, 2008    (JP) .................................. 2008-092421

(51) Int. Cl.
*H01L 21/336* (2006.01)
*H01L 21/31* (2006.01)

(52) U.S. Cl. ........ 438/287; 438/288; 438/788; 438/792; 257/E21.423

(58) Field of Classification Search .......... 438/287–288, 438/788, 789, 792, 793; 257/E21.423; 118/723 AN
See application file for complete search history.

(56) References Cited

U.S. PATENT DOCUMENTS

| 5,053,832 A * | 10/1991 | Uchida .............................. 257/4 |
| 2006/0269694 A1 * | 11/2006 | Honda et al. .................. 427/569 |
| 2008/0012065 A1 * | 1/2008 | Kumar ........................... 257/324 |
| 2010/0052040 A1 | 3/2010 | Kohno et al. |
| 2010/0283097 A1 * | 11/2010 | Endoh et al. .................. 257/324 |

FOREIGN PATENT DOCUMENTS

| JP | 58-054674 | 3/1983 |
| JP | 01-095562 | 4/1989 |

(Continued)

OTHER PUBLICATIONS

International Search Report—PCT/JP2009/057019 dated Jul. 14, 2009.

(Continued)

*Primary Examiner* — Kevin Parendo
(74) *Attorney, Agent, or Firm* — Cantor Colburn LLP

(57) ABSTRACT

To manufacture a MOS memory device having a dielectric film laminate in which adjacent dielectric films have band-gaps of different magnitudes, a plasma processing device which transmits microwaves to a chamber by means of a planar antenna having a plurality of holes is used to perform plasma CVD under pressure conditions that differ from at least pressure conditions used when forming the adjacent dielectric films, and the dielectric films are sequentially formed by altering the band-gaps of the adjacent dielectric films that constitute the dielectric film laminate.

10 Claims, 16 Drawing Sheets

FOREIGN PATENT DOCUMENTS

| | | |
|---|---|---|
| JP | 03-009571 | 1/1991 |
| JP | 05-082795 | 4/1993 |
| JP | 2002-203917 | 7/2002 |
| JP | 2004-193409 | 7/2004 |
| JP | 2005-039138 | 2/2005 |
| WO | 2007/139142 | 12/2007 |
| WO | 2008/156215 | 12/2008 |

OTHER PUBLICATIONS

Masashi Miura, et al. "Depth Profiling of Chemical Composition and Defect State Density of SiNx Formed by Plasma CVD", IEICE Technical Report, May 31, 2007, pp. 17-22, SDM107 (85), Japan.

Korean Office Action—Korean Application No. 10-2010-7021780 issued on Oct. 11, 2011, citing JP 2005-039138 and JP 2004-193409.

* cited by examiner

US 8,124,484 B2

FORMING A MOS MEMORY DEVICE HAVING A DIELECTRIC FILM LAMINATE AS A CHARGE ACCUMULATION REGION

TECHNICAL FIELD

The present invention relates to a method for manufacturing a MOS (Metal-Oxide-Semiconductor) memory device and a plasma CVD device used in the method.

BACKGROUND ART

Currently, an EEPROM (Electrically-Erasable-and-Programmable-ROM) capable of electrically performing a rewrite operation is known as one of MOS memory devices. This device has a structure in which a silicon oxide film is formed on a semiconductor substrate, at least one silicon nitride film is formed on the silicon oxide film, a silicon oxide film is additionally formed on the silicon nitride film, and a control gate electrode is formed on the additionally formed silicon oxide film (for example, refer to FIGS. 1 and 2 of Patent Document 1). The EEPROM rewrites data [1] and [0] by applying a voltage between the semiconductor substrate and the control gate electrode to accumulate electrons or holes mainly on an interface between the silicon nitride film and the silicon oxide films, or in the silicon nitride film, of dielectric films (a dielectric film laminate) of the laminate structure.

A conventional art will be explained below, for example, in case that electrons are injected into the dielectric film laminate as a charge accumulation region. First, 0 V is applied to the semiconductor substrate, and for example, 10 V is applied to the control gate electrode. Accordingly, a strong electric field is applied to the dielectric film laminate between the semiconductor substrate and the control gate electrode, and thus electrons are injected due to tunneling effect through the lower silicon oxide film from the semiconductor substrate to the silicon nitride film. Then, the injected electrons are trapped mainly in the silicon nitride film, or around the interface between the silicon nitride film and the lower silicon oxide film or between the silicon nitride film and the upper silicon oxide film, thereby being accumulated as data.

However, an important performance required for a nonvolatile semiconductor memory device, such as EEPROM, is data holding characteristics. In order for a conventional MOS memory device to stably hold the electrons trapped in the silicon nitride film or around the interface between the silicon nitride film and the lower silicon oxide film or between the silicon nitride film and the upper silicon oxide film, thicknesses of the upper and lower silicon oxide films need to be large. However, if the thicknesses of the upper and lower silicon oxide films are large, an electric field applied to the dielectric film laminate during a data write operation is weakened, thereby reducing a data write speed.

Although the above problem may be solved by increasing the strength of an electric field applied to the dielectric film laminate, a data write voltage needs to be increased in order to increase the strength of the electric field. However, if so, power consumption of the semiconductor memory device is increased and a probability that the dielectric films are destructed is increased, thereby greatly lowering the reliability of the semiconductor memory device.

(Patent Document 1) Japanese Laid-open Patent Publication No. 2002-203917

DISCLOSURE OF THE INVENTION

Technical Problem

The present inventors have found that excellent data holding characteristics, high-speed data rewrite performance, low-power operation, and high reliability may be achieved by controlling a band-gap structure of dielectric films constituting a dielectric film laminate functioning as a charge accumulation region in a MOS memory device.

However, in a film formation process using a conventional CVD method, in order to change a band-gap of each dielectric film, it is necessary to change a material itself (for example, silicon nitride, silicon oxide, silicon oxynitride, or the like) of the film. In order to form a dielectric film laminate by changing a material of each film, whenever one dielectric film is formed, film formation conditions including a material gas need to be drastically changed, thereby lowering process efficiency, for example, requiring a plurality of film formation devices.

The present invention is proposed considering the above problems. According to the present invention, a method for manufacturing a MOS memory device, by which a MOS memory device including a dielectric film laminate in which adjacent dielectric films have band-gaps of different magnitudes may be easily manufactured.

Technical Solution

According to an aspect of the present invention, there is provided a method for manufacturing a MOS memory device where a dielectric film laminate in which a plurality of dielectric films are stacked is formed as a charge accumulation region between a semiconductor layer and a gate electrode, the method including forming the dielectric film laminate by sequentially forming the dielectric films in such a way that magnitudes of band-gaps of adjacent dielectric films constituting the dielectric film laminate are altered, by plasmatizing a material gas under pressure conditions that differ from at least pressure conditions used when forming the adjacent dielectric films and forming plasma CVD, by using a plasma processing device which transmits microwaves to a processing chamber by means of a planar antenna having a plurality of holes formed therein.

In the forming of the dielectric film laminate, an ammonia gas and a silicon-containing compound gas are used as the material gas, and the forming of the dielectric film laminate comprises forming a silicon nitride film having a first band-gap by performing plasma CVD at a first pressure of a range of 1 Pa to 1333 Pa; and forming a silicon nitride film having a second band-gap that is larger or smaller than the first band-gap, by performing plasma CVD at a second pressure, which is different from the first pressure, which ranges from 1 Pa to 1333 Pa.

In the forming of the dielectric film laminate, a nitrogen gas and a silicon-containing compound gas are used as the material gas, and the forming of the dielectric film laminate comprises forming a silicon nitride film having a first band-gap by performing plasma CVD at a first pressure of a range of 1 Pa to 1333 Pa; and forming a silicon nitride film having a second band-gap that is larger or smaller than the first band-gap, by performing plasma CVD at a second pressure, which is different from the first pressure, which ranges from 1 Pa to 1333 Pa.

The forming of the dielectric film laminate may include: forming a first dielectric film at a position closest to the semiconductor layer; forming a second dielectric film having a band-gap that is smaller than that of the first dielectric film; forming a third dielectric film having a band-gap that is larger than that of the second dielectric film; forming a fourth dielectric film having a band-gap that is smaller than that of the third dielectric film; and forming a fifth dielectric film having a band-gap, which is larger than that of the fourth dielectric film, at a position closest to the gate electrode.

The forming of the dielectric film laminate may include: forming a first dielectric film at a position closest to the semiconductor layer; forming a second dielectric film having a band-gap that is smaller than that of the first dielectric film; forming a third dielectric film having a band-gap that is smaller than that of the second dielectric film; forming a fourth dielectric film having a band-gap that is larger than that of the third dielectric film; and forming a fifth dielectric film having a band-gap, which is larger than that of the fourth dielectric film, at a position closest to the gate electrode.

In the forming of the third dielectric film, the MOS memory device may have an energy band structure in which in a film thickness direction leading from the semiconductor layer side to the gate electrode side, band-gaps are gradually increased or decreased from a vicinity of an interface between the second dielectric film and the third dielectric film toward a vicinity of an interface between the fourth dielectric film and the third dielectric film.

An intermediate laminate including the second dielectric film, the third dielectric film, and the fourth dielectric film may be repeatedly formed between the first dielectric film and the fifth dielectric film.

Silicon oxide films may be formed as the first dielectric film and the fifth dielectric film, and Silicon nitride films may be formed as the second dielectric film, the third dielectric film, and the fourth dielectric film.

According to another aspect of the present invention, there is provided a computer-readable recording medium having embodied thereon a control program for, when a MOS memory device where a dielectric film laminate in which a plurality of dielectric films are stacked is formed as a charge accumulation region between a semiconductor layer and a gate electrode is to be manufactured, controlling a plasma CVD device to form the dielectric film laminate by sequentially forming the dielectric films in such a way that magnitudes of band-gaps of adjacent dielectric films constituting the dielectric film laminate are altered, by plasmatizing the material gas under pressure conditions that differ from at least pressure conditions used when forming the adjacent dielectric films and performing plasma CVD in a processing chamber.

According to another aspect of the present invention, there is provided a plasma CVD apparatus which forms a dielectric film on an object to be processed by using a plasma CVD method, the plasma CVD apparatus including: a processing chamber in which the object to be processed is held on a holding stage and received; a dielectric member which closes an opening portion of the processing chamber; an antenna which is formed outside the dielectric member and through which microwaves are guided to the processing chamber; a gas supply mechanism which supplies a material gas into the processing chamber; an exhaust mechanism which depressurizes the processing chamber to discharge a gas; and a control unit which, when a MOS memory device having a dielectric film laminate in which a plurality of dielectric films are stacked as a charge accumulation region between a semiconductor layer and a gate electrode is to be manufactured, controls the dielectric film laminate to be formed by sequentially forming the dielectric films in such a way that magnitudes of band-gaps of adjacent dielectric films constituting the dielectric film laminate are altered, by plasmatizing the material gas under pressure conditions that differ from at least pressure conditions used when forming the adjacent dielectric films and performing plasma CVD in the processing chamber.

ADVANTAGEOUS EFFECTS

According to a method for manufacturing a MOS memory device of the present invention, since plasma CVD is performed under pressure conditions that differ from at least pressure conditions used when forming adjacent dielectric films, the dielectric films may be sequentially alternately deposited while altering magnitudes of band-gaps of the adjacent dielectric films that constitute a dielectric film laminate. In particular, since magnitudes of band-gaps may be easily controlled by using only a processing pressure, films may be continuously formed when a laminate of dielectric films having different band-gaps is to be formed with high precision, thereby greatly improving process efficiency.

Also, since a band-gap of a silicon nitride film may be easily adjusted with high precision by adjusting only a processing pressure, dielectric film laminates having various band-gap structures can be simply manufactured. Accordingly, the method for manufacturing the MOS memory device of the present invention is an optimal process for manufacturing a MOS memory device having excellent data holding characteristics, high-speed data rewrite performance, low-power operation, and high reliability.

BEST MODE FOR CARRYING OUT THE INVENTION

First Embodiment

Figure 1:
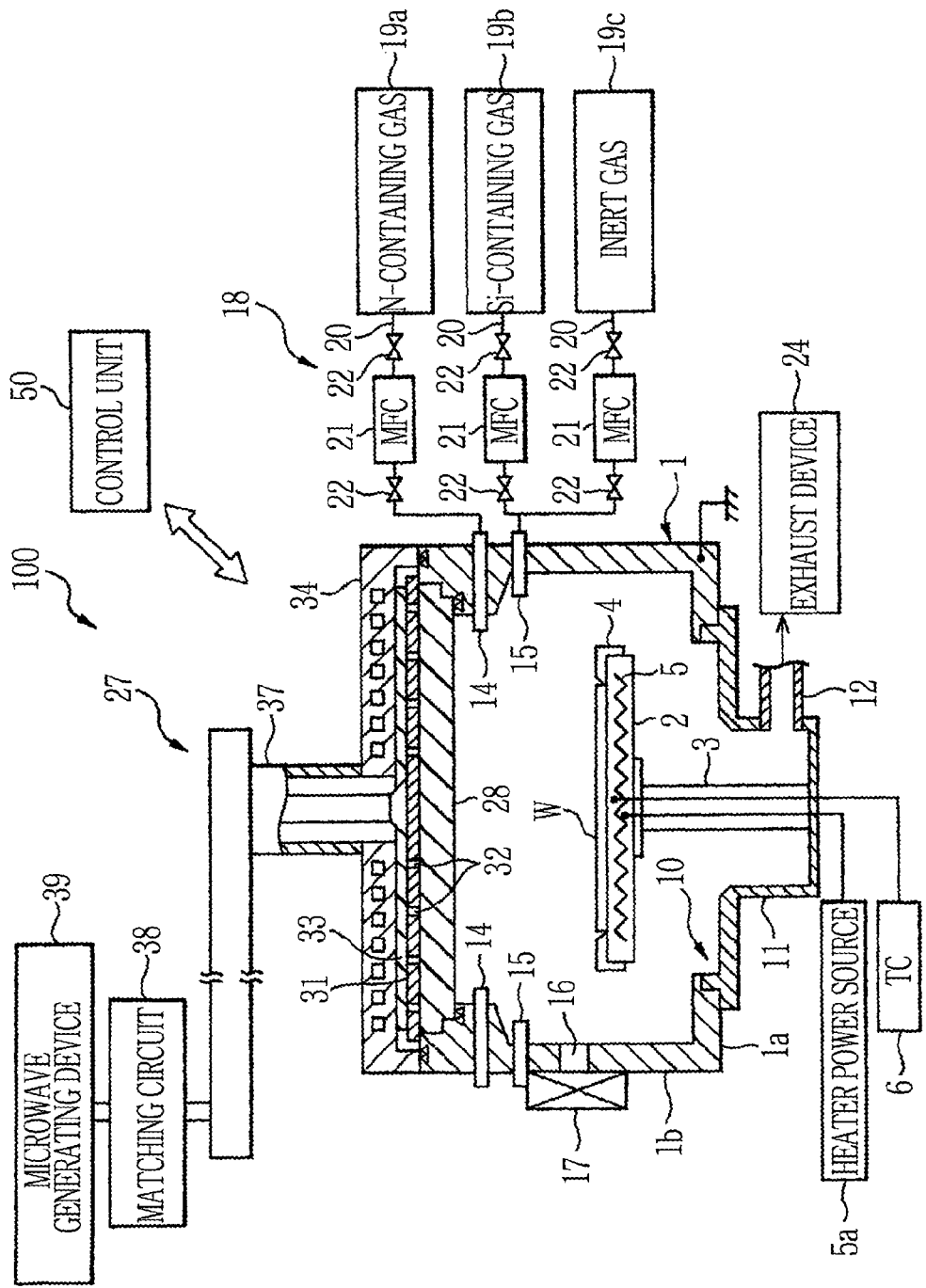
FIG. 1 is a schematic cross-sectional view showing an example of a plasma processing device suitable for forming a dielectric film.

Hereinafter, embodiments of the present invention will be explained in detail with reference to the drawings. FIG. 1 is a cross-sectional view schematically showing a configuration of a plasma processing device 100 that is usable as a plasma CVD device in a method for manufacturing a MOS memory device according to the present invention.

The plasma processing device 100 is an RLSA (Radial-Line-Slot-Antenna) microwave plasma processing device that can generate microwave-excited plasma having high density and low electron temperature by transmitting microwaves to a processing chamber by means of a planar antenna, in particular, an RLSA, having a plurality of slot-shaped holes formed therein to generate plasma. The plasma processing device 100 can perform processing by using plasma having a density of $1 \times 10^{10}$ to $5 \times 10^{12}/cm^3$ and a low electron temperature of 0.7 to 2 eV. Accordingly, the plasma processing device 100 may be very suitably used to form a silicon nitride film by using a plasma CVD method in various semiconductor device manufacturing processes.

The plasma processing device 100 includes, as main elements, a chamber 1 (processing chamber) that is airtight, a gas supply mechanism 18 for supplying gas into the chamber 1, an exhaust device 24 acting as an exhaust mechanism for exhausting the chamber 1 to be depressurized, a microwave transmitting mechanism 27 formed over the chamber 1 and designed to transmit microwaves to the chamber 1, and a control unit 50 for controlling each of the elements of the plasma processing device 100.

The chamber 1 is formed as a substantially cylindrical container that is grounded. Also, the chamber 1 may be formed as an polygonal container. The chamber 1 includes a bottom wall 1a and a side wall 1b formed of a material such as aluminum or the like.

A holding stage 2 for horizontally supporting a silicon wafer (hereinafter, simply referred to as a wafer W) that is an object to be processed is formed in the chamber 1. The holding stage 2 is formed of a material having high thermal conductivity, for example, ceramics such as AlN. The holding stage 2 is supported by a cylindrical support member 3 that upwardly extends from a center of a bottom portion of an exhaust chamber 11. The support member 3 is formed of ceramics such as AlN or the like.

Also, a cover ring 4 for covering an outer peripheral portion of the holding stage 2 and guiding the wafer W is formed on the holding stage 2. The cover ring 4 is an annular member formed of a material such as quartz, AlN, $Al_2O_3$, SiN, or the like.

Also, a resistor heating-type heater 5 is buried as a temperature regulating mechanism in the holding stage 2. The heater 5 heats the holding stage 2 by being supplied with power from a heater power source 5a, and uniformly heats the wafer W that is a substrate to be processed by using the heat.

Also, a thermocouple (TC) 6 is disposed at the holding stage 2. By measuring a temperature by means of the TC 6, a heating temperature of the wafer W may be controlled to range, for example, from room temperature to 900° C.

Also, wafer support pins (not shown) for raising and lowering the wafer W are disposed on the holding stage 2. Each of the wafer support pins may protrude from or sink into a surface of the holding stage 2.

A circular opening portion 10 is formed in a substantially central portion of the bottom wall 1a of the chamber 1. The exhaust chamber 11 is formed on the bottom wall 1a to downwardly protrude and communicate with the opening portion 10. An exhaust pipe 12 is connected to the exhaust chamber 11, and the exhaust chamber 11 is connected to the exhaust device 24 through the exhaust pipe 12.

An annular gas introduction portion 14 is formed on an upper end of the side wall 1b of the chamber 1. Also, an annular gas introduction portion 15 is formed on the side wall 1b of the chamber 1. That is, the gas introduction portions 14 and 15 have a two-stepped shape. Each of the gas introduction portions 14 and 15 is connected to the gas supply mechanism 18 for supplying a material gas for forming a film or a gas for exciting plasma. Also, the gas introduction portions 14 and 15 may be nozzle-type or shower-type gas introduction portions.

Also, an inlet/outlet 16 for transferring the wafer W between the plasma processing device 100 and a transfer chamber (not shown) which is adjacent to the device, and a gate valve 17 for opening and closing the inlet/outlet 16 are formed at the side wall 1b of the chamber 1.

The gas supply mechanism 18 is connected to the gas introduction portions 14 and 15 through a pipe, and includes, for example, a nitrogen-containing gas (N-containing gas) supply source 19a, a silicon-containing gas (Si-containing gas) supply source 19b, and an inert gas supply source 19c. The nitrogen-containing gas supply source 19a is connected to the upper gas introduction portion 14. Also, the silicon-containing gas supply source 19b and the inert gas supply source 19c are connected to the lower gas introduction portion 15. Also, the gas supply mechanism 18 may include, for example, a cleaning gas supply source used to clean the chamber 1 as another gas supply source that is not shown.

As the nitrogen-containing gas that is a material gas, a gas such as a nitrogen gas ($N_2$), ammonia ($NH_3$), a hydrazine derivative such as MMH (monomethyl hydrazine) or the like, or the like may be used. Also, as the silicon-containing gas that is another material gas, a gas such as silane ($SiH_4$), disilane ($Si_2H_6$), trisilane ($Si_3H_8$), TSA (trisilylamine), or the like may be used. From among them, in particular, disilane ($Si_2H_6$) is preferable. Also, as the inert gas, for example, an $N_2$ gas or a rare gas or the like may be used. The rare gas, which is a gas for exciting plasma to stably generate plasma, may be, for example, an Ar gas, a Kr gas, a Xe gas, a He gas, or the like.

The nitrogen-containing gas is introduced into the chamber 1 from the gas introduction portion 14 through a gas line 20 from the nitrogen-containing gas supply source 19a of the gas supply mechanism 18. Meanwhile, the silicon-containing gas and the inert gas are introduced into the chamber 1 from the gas introduction portion 15 through gas lines 20, respectively, from the silicon-containing gas supply source 19b and the inert gas supply source 19c. Mass flow controllers 21 and opening/closing valves 22 located before and after the mass flow controllers 21 are formed on each of the gas lines 20, to control the exchange or flow rate of supplied gases.

A gas in the chamber 1 is exhausted by the exhaust device 24 to the outside through the exhaust pipe 12. Accordingly, the chamber 1 may be depressurized at high speed to a predetermined vacuum level of, for example, 0.133 Pa. Also, a pressure gauge (not shown) is disposed on the chamber 1, to measure a pressure in the chamber 1.

As shown in FIG. 1, the microwave transmitting mechanism 27 includes, as main elements, a transmission plate 28, a planar antenna 31, a wavelength-shortening member 33, a cover 34, a waveguide 37, a matching circuit 38, and a microwave generating device 39.

The planar antenna 31 is formed of, for example, copper plate or an aluminum plate of which surface is plated of, for example, a gold or a silver. The planar antenna 31 has a plurality of slot-shaped microwave radiation holes 32 through which microwaves are radiated. The microwave radiation holes 32 pass through the planar antenna 31 in a predetermined pattern.

Figure 2:
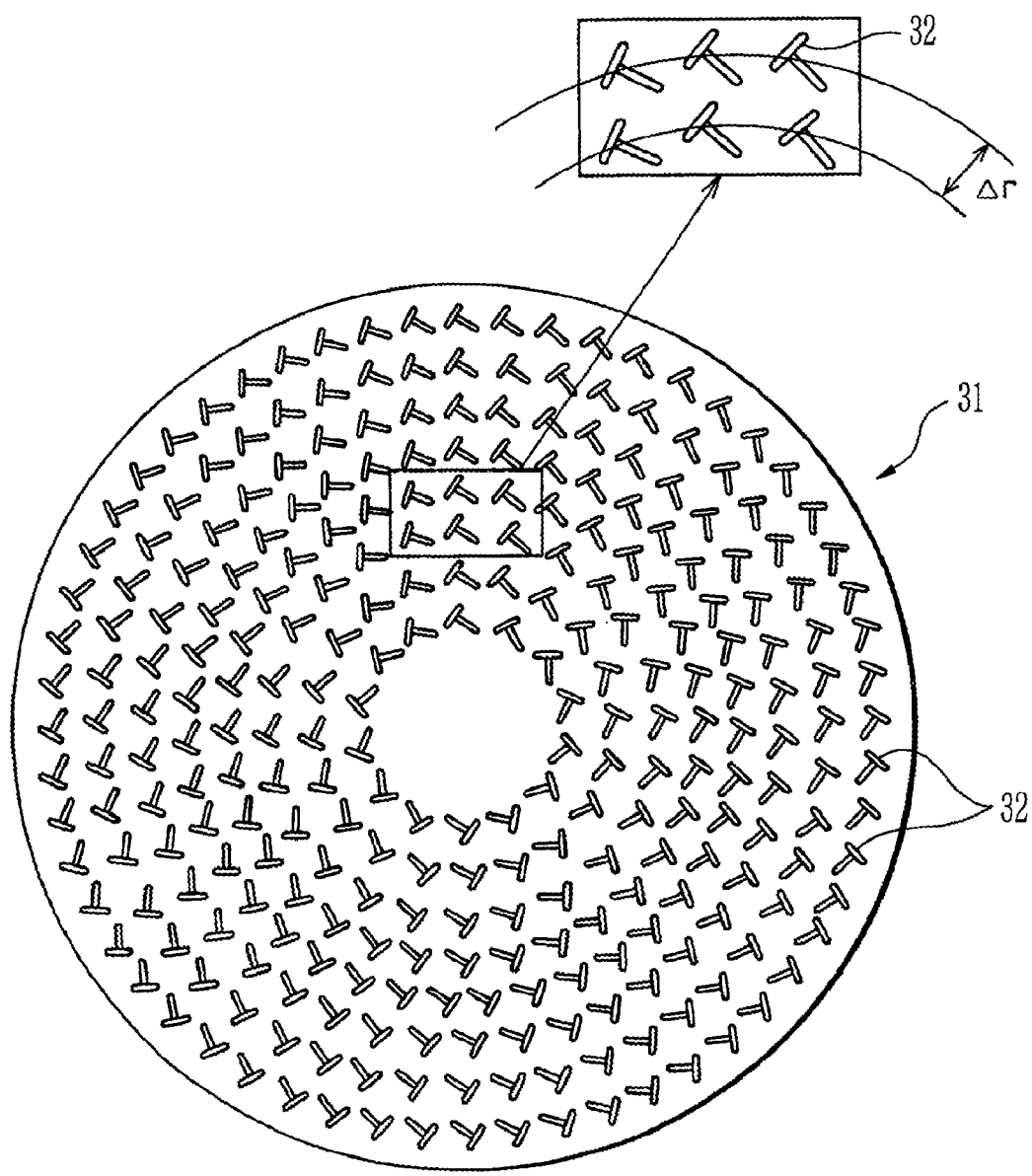
FIG. 2 is a view showing a structure of a planar antenna.

As shown in FIG. 2, each of the microwave radiation holes 32 has, for example, a thin long rectangular shape (slot shape). Then, adjacent microwave radiation holes 32 are typically disposed in a T-shape. Also, the microwave radiation holes 32 disposed in a predetermined shape (e.g., a T-shape) are arranged in a concentric shape when viewed as a whole.

A length of each of the microwave radiation holes 32 and a distance between the microwave radiation holes 32 are determined according to wavelengths λg of microwaves. For example, a distance between the microwave radiation holes 32 ranges from λg/4 to λg. Also, in FIG. 2, a distance between adjacent groups of microwave radiation holes 32 which are formed in a concentric shape is denoted by Δr. The microwave radiation holes 32 may have any other shape such as a circular shape, an arc shape, or the like. Also, the arrangement shape of the microwave radiation holes 32 is not limited to the concentric shape, and the microwave radiation holes 32 may be arranged in, for example, a spiral shape, a radial shape, or the like.

Figure 3:
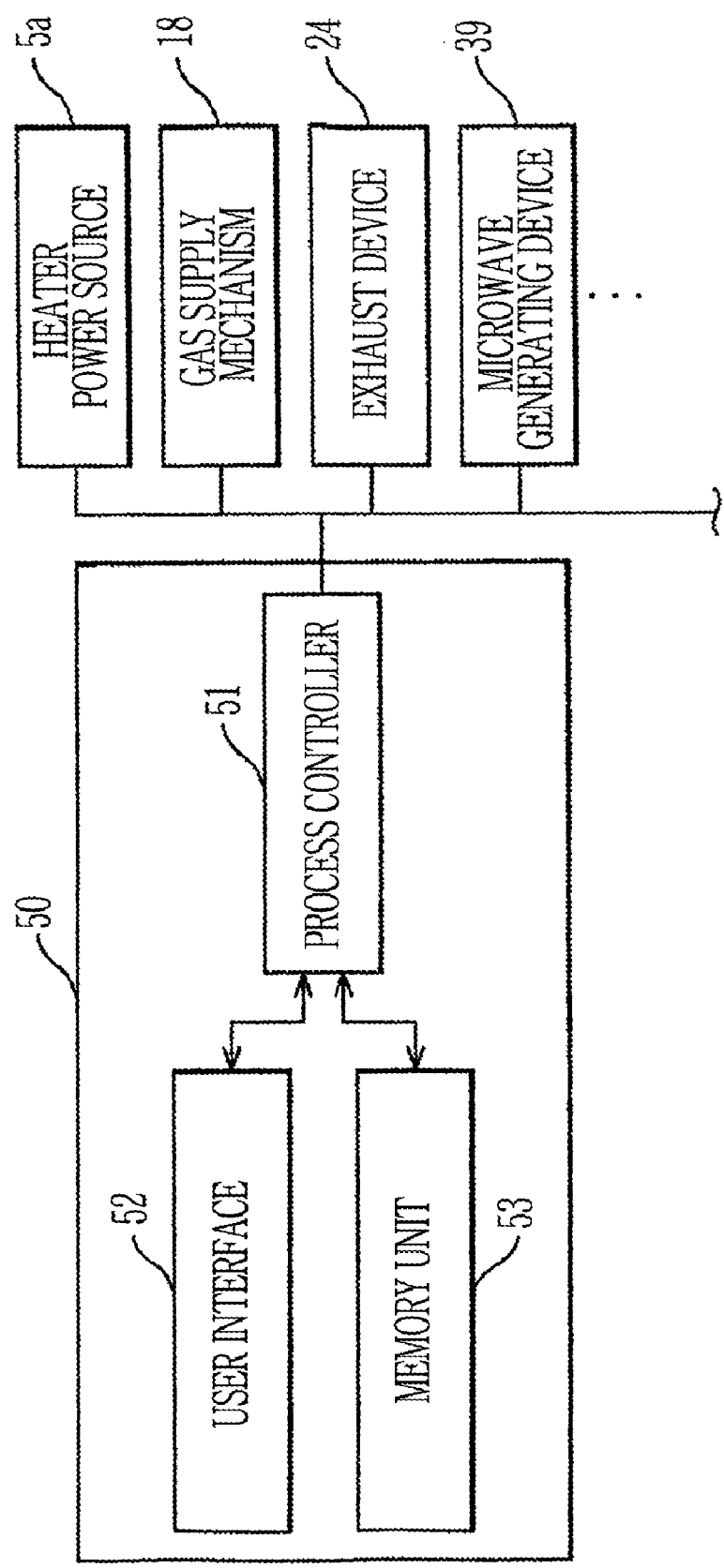
FIG. 3 is a diagram for explaining a configuration of a control unit.

Each of the elements of the plasma processing device 100 is connected to and controlled by the control unit 50. As shown in FIG. 3, the control unit 50 includes a computer, and thus includes, for example, a process controller 51 including a CPU, and a user interface 52 and a memory unit 53 connected to the process controller 51. The process controller 51 is a control unit for integratedly controlling each of the elements related to process conditions, such as temperature, pressure, gas flow rate, microwave output power, and the like (for example, the heater power source 5a, the gas supply mechanism 18, the exhaust device 24, the microwave generating device 39, and the like).

The user interface 52 includes a keyboard by which a command is input and manipulated in order for a process manager to manage the plasma processing device 100, a display on which how the plasma display device 100 operates is displayed, and the like. Also, a recipe, such as process condition data, control programs (software), or the like, for performing various processes by means of the plasma processing device 100 under the control of the process controller 51 is stored in the memory unit 53.

Then, if necessary, a desired process is performed in the chamber 1 of the plasma processing device 100 under the control of the process controller 51 by reading an arbitrary recipe from the memory unit 53 and performing a process according to the recipe by means of the process controller 51 upon receiving an instruction from the user interface 52. Also, the recipe, such as the process condition data, the control programs, or the like, may be used in a state stored in a computer-readable storing medium, for example, a CD-ROM, a hard disk, a flexible disk, a flash memory, a DVD, a blu-ray disk, or the like, or may be used online by being transmitted at any time online from another device through, for example, a dedicated line.

Now, a processing for depositing silicon nitride films by using a plasma CVD method using the RLSA plasma processing device 100 will be explained. Initially, the gate valve 17 is opened to transfer the wafer W into the chamber 1 from the inlet/outlet 16 and hold the wafer W on the holding stage 2. Next, the chamber 1 is depressurized, and a nitrogen-containing gas, a silicon-containing gas, and if necessary, an inert gas are introduced at predetermined flow rates into the chamber 1 through the gas introduction portions 14 and 15, respectively from the nitrogen-containing gas supply source 19a, the silicon-containing gas supply source 19b, and the inert gas supply source 19c of the gas supply mechanism 18. As such, a pressure in the chamber 1 is adjusted to a predetermined pressure. It is preferable that a rare gas is introduced in order to stably generate plasma and form uniform films in the chamber 1.

Next, microwaves having a predetermined frequency, for example, 2.45 GHz, generated by the microwave generating device 39 are radiated from the slot-shaped microwave radiation holes 32 passing through the planar antenna 31 into a space above the wafer W in the chamber 1 through the transmission plate 28. The microwaves may be output at, for example, about 500 to 3000 W (about 0.25 to 1.54 W per 1 cm² of the transmission plate 28).

An electromagnetic field is formed in the chamber 1 due to the microwaves radiated into the chamber 1 through the transmission plate 28 from the planar antenna 31, and the rare gas and the material gas such as the nitrogen-containing gas, the silicon-containing gas, or the like are plasmatized. Then, the material gas in the plasma begins to be dissociated, and a thin film of silicon nitride (SiN) is deposited due to a reaction of active species such as $Si_pH_q$, $SiH_q$, $NH_q$, and N (throughout the specification, p and q are arbitrary numbers).

Figure 4:
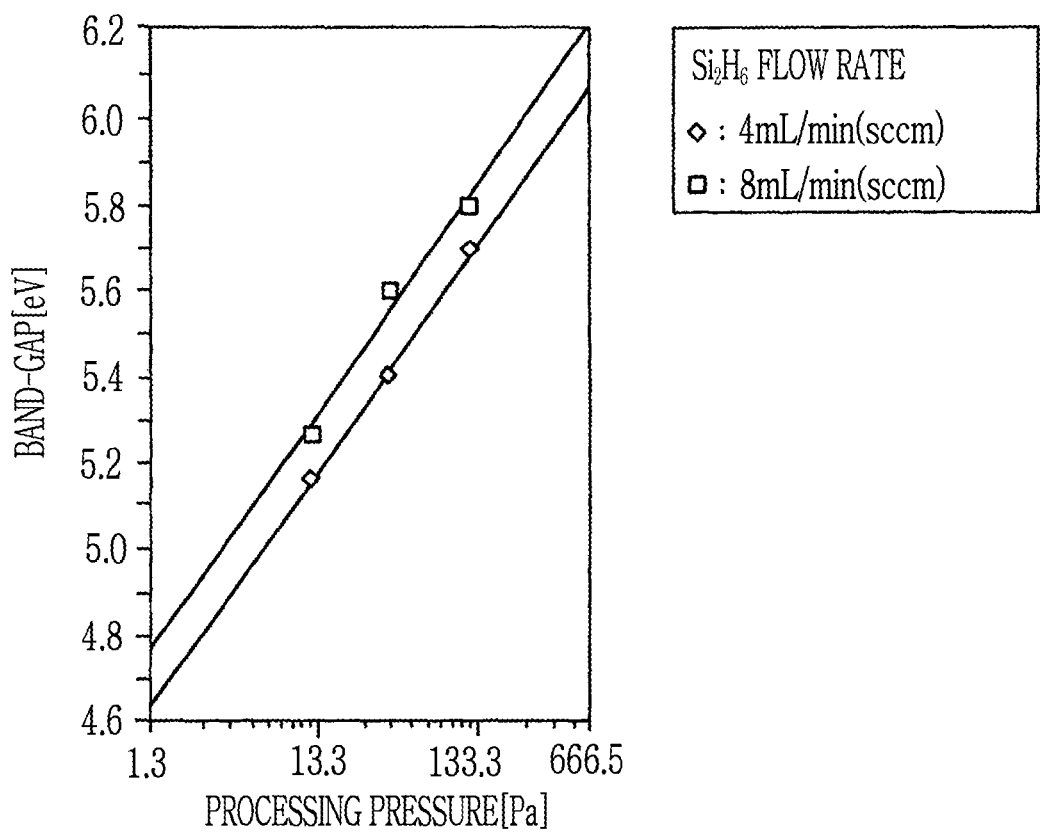
FIG. 4 is a graph showing a relationship between a band-gap and a processing pressure in plasma CVD using ammonia as a material gas.
Figure 5:
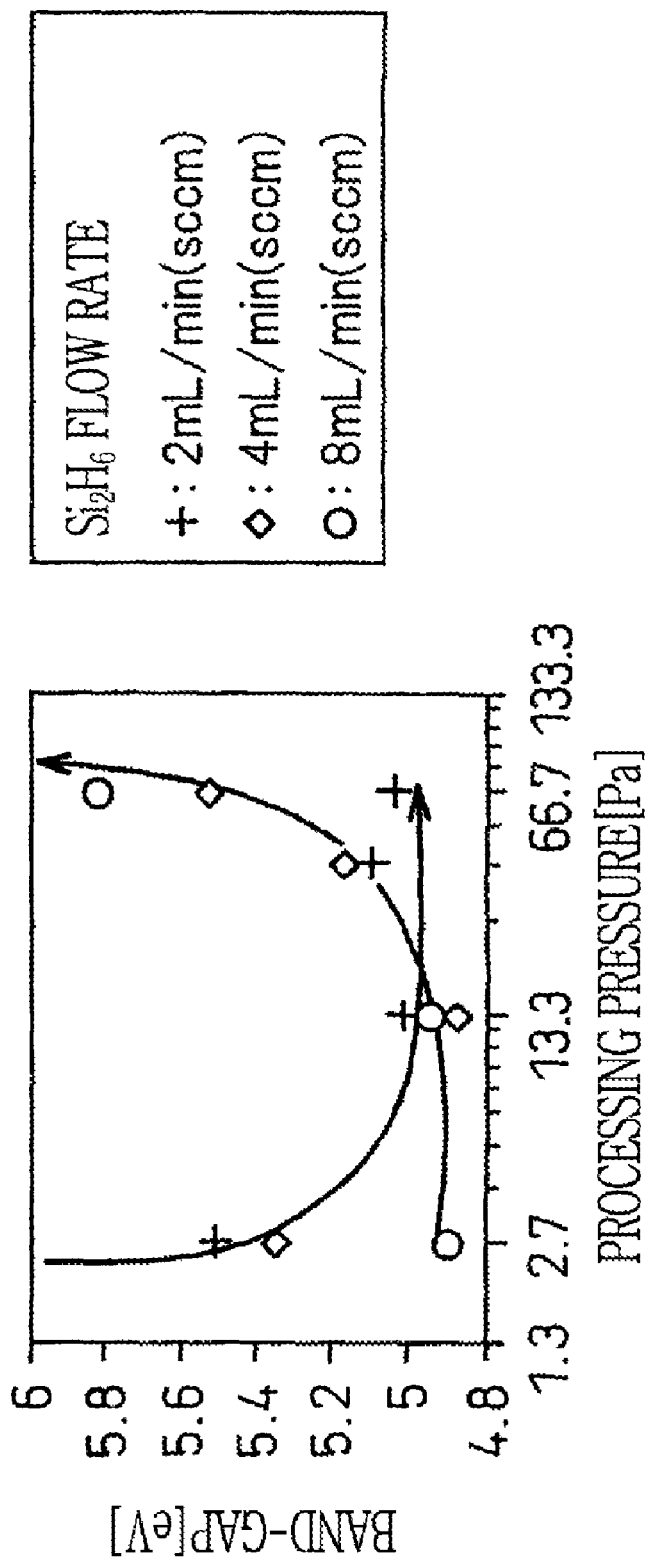
FIG. 5 is a graph showing a relationship between a band-gap and a processing pressure in plasma CVD using nitrogen as a material gas.

In the plasma processing device 100 configured as described above, a band-gap of a silicon nitride film to be formed may be controlled to have a desired magnitude by selecting plasma CVD process conditions, in particular, pressure conditions. This will be explained based on experimental data. FIGS. 4 and 5 show a relationship between a band-gap of a silicon nitride film and a processing pressure when a single silicon nitride film is formed by performing plasma CVD using the plasma processing device 100. FIG. 4 shows a result when a $NH_3$ gas is used as the nitrogen-containing gas and a $Si_2H_6$ gas is used as the silicon-containing gas. FIG. 5 shows a result when a $N_2$ gas is used as the nitrogen-containing gas and a $Si_2H_6$ gas is used as the silicon-containing gas. Plasma CVD conditions are shown as follows.

[Common Conditions]
processing temperature (holding stage): 400° C.
microwave power: 2 kW (power density 1.02 W/cm² of transmission plate)
[$NH_3/Si_2H_6$-based]
processing pressure: 13.3 Pa (100 mTorr)☐133.3 Pa (1000 mTorr)
Ar gas flow rate: 200 mL/min (sccm)
$NH_3$ gas flow rate: 200 mL/min (sccm)
$Si_2H_6$ gas flow rate: 4 or 8 mL/min (sccm)
[$N_2/Si_2H_6$-based]
processing pressure: 2.7 Pa (20 mTorr)☐66.7 Pa (500 mTorr)
Ar gas flow rate: 200 mL/min (sccm)
$N_2$ gas flow rate: 200 mL/min (sccm)
$Si_2H_6$ gas flow rate: 2, 4 or 8 mL/min (sccm)

Also, a band-gap of a silicon nitride film was measured by using a thin film characteristic measuring device, named n & k-Analyzer (a model manufactured by n & k technology, Inc.).

As shown in FIG. 4, in plasma CVD using a $NH_3/Si_2H_6$-based material gas for forming a film, when a processing pressure was changed in a range of 13.3 Pa to 133.3 Pa, a band-gap of a formed silicon nitride film was changed in a range of about 5.1 eV to 5.8 eV. That is, a silicon nitride film having a desired band-gap could be easily formed by changing only a processing pressure while maintaining a flow rate of the $Si_2H_6$ gas at a constant level. In this case, the processing pressure may be controlled mainly, and the flow rate of the $Si_2H_6$ gas may be controlled as necessary. For example, the flow rate of the $Si_2H_6$ gas is preferably in a range of 3 mL/min (sccm) to 40 mL/min (sccm), and more preferably in a range of 3 mL/min (sccm) to 20 mL/min (sccm). A flow rate of the $NH_3$ gas is preferably in a range of 50 mL/min (sccm) to 1000 mL/min (sccm), and more preferably in a range of 50 mL/min (sccm) to 500 mL/min (sccm). Also, a ratio of the flow rates of the $Si_2H_6$ gas and the $NH_3$ gas ($Si_2H_6/NH_3$) is preferably in a range of 0.015 to 0.2, and more preferably in a range of 0.015 to 0.1.

Also, as shown in FIG. 5, in plasma CVD using a $N_2/Si_2H_6$-based material gas for forming a film, when a processing pressure was changed in a range of 2.7 Pa to 66.7 Pa, a band-gap of a formed silicon nitride film was changed from about 4.9 eV to 5.8 eV. Also, a magnitude of a band-gap could be changed by changing a flow rate of the $Si_2H_6$ gas at a processing pressure of 2.7 Pa or 66.7 Pa. In this case, a ratio of flow rates of the $Si_2H_6$ gas and the $N_2$ gas ($Si_2H_6/N_2$) is preferably in a range of 0.01 to 0.2, and more preferably in a range of 0.01 to 0.1.

As described above, a silicon nitride film having a band-gap larger than 4.9 eV may be formed by controlling a ratio of flow rates of a material gas and a processing pressure.

Also, for comparison, although the silicon nitride films were formed by LPCVD by changing the processing pressure under the same conditions, the band-gaps were changed in a range of 4.9 eV to 5 eV and 0.1 eV. Accordingly, it was difficult to control the band-gaps in the LPCVD.

As described above, in the plasma CVD processing using the plasma processing device 100, a main factor that determines a magnitude of a band-gap of a formed film is a processing pressure. Accordingly, it was found that a silicon nitride film having a relatively larger band-gap and a silicon nitride film having a relatively smaller band-gap can be easily formed by changing a processing pressure while maintaining other conditions by using the plasma processing device 100.

[When Film Having Large Band-Gap is Formed]

In order to increase a magnitude of a band-gap of a silicon nitride film to be formed (for example, in order to set the magnitude of a band-gap to range from 5 eV to 7 eV), it is preferable that plasma CVD processing is performed under the following conditions.

When an $NH_3$ gas is used as the nitrogen-containing gas and a silane-based gas, such as a $Si_2H_6$ gas, is used as the silicon-containing gas, the processing pressure is preferably in a range of 1 to 1333 Pa, and more preferably in a range of 1 to 133 Pa. Also, in this case, a ratio of a flow rate of the $NH_3$ gas to a total gas flow rate is in a range of 10 to 99.99%, and preferably in a range of 90 to 99.9%, and a ratio of a flow rate of the $Si_2H_6$ gas to a total gas flow rate is in a range of 0.01 to 90%, and preferably in a range of 0.1 to 10%. In this case, a ratio of the flow rates of the $Si_2H_6$ gas and the $NH_3$ gas (the flow rate of the $Si_2H_6$ gas to the flow rate of the $NH_3$ gas) is preferably in a range of 0.015 to 0.2 in order to increase the amount of charges trapped in the silicon nitride film, to increase a write speed and an erase speed, and to improve charge holding performance. Also, under the conditions where a flow rate of the rare gas is in a range of 20 to 2000 mL/min (sccm) and preferably in a range of 20 to 1000 mL/min (sccm), a flow rate of the $NH_3$ gas is in a range of 20 to 3000 mL/min (sccm) and preferably in a range of 20 to 1000 mL/min (sccm), and a flow rate of the $Si_2H_6$ gas is in a range of 0.1 to 50 mL/min (sccm) and preferably in a range of 0.5 to 10 mL/min (sccm), the ratio of the flow rates above may be set.

Also, when a $N_2$ gas is used as the nitrogen-containing gas and a silane-based gas, such as a $Si_2H_6$ gas, is used as the silicon-containing gas, the processing pressure is preferably in a range of 1 to 1333 Pa, and more preferably in a range of 1 to 133 Pa. A ratio of a flow rate of the $N_2$ gas to a total gas flow rate is in a range of 10 to 99.99% and preferably in a range of 90 to 99.99%, and a ratio of a flow rate of the $Si_2H_6$ gas to a total gas flow rate is in a range of 0.01 to 90% and preferably in a range of 0.01 to 10%. In this case, a ratio of the flow rates of the $Si_2H_6$ gas and the $N_2$ gas (the flow rate of the $Si_2H_6$ gas to the flow rate of the $N_2$ gas) is preferably in a range of 0.01 to 0.2 in order to increase the amount of charges trapped in the silicon nitride film, to increase a write speed and an erase speed, and to improve charge holding performance. Also, under the conditions where a flow rate of the rare gas is in a range of 20 to 3000 mL/min (sccm) and preferably in a range of 20 to 1000 mL/min (sccm), a flow rate of the $N_2$ gas is in a range of 50 to 3000 mL/min (sccm) and preferably in a range of 200 to 1500 mL/min (sccm), and a flow rate of the $Si_2H_6$ gas is in a range of 0.1 to 50 mL/min (sccm) and preferably in a range of 0.5 to 5 mL/min (sccm), the ratio of the flow rates above may be set.

[When Film Having Small Band-Gap is Formed]

In order to decrease a magnitude of a band-gap of a silicon nitride film to be formed (for example, in order to set the magnitude of the band-gap to range from 2.5 to 5 eV), it is preferable that plasma CVD processing is performed under the following conditions.

When a $NH_3$ gas is used as the nitrogen-containing gas and a silane-based gas, such as a $Si_2H_6$ gas, is used as the silicon-containing gas, the processing pressure is preferably in a range of 1 to 1333 Pa, and more preferably in a range of 1 to 133 Pa. Also, in this case, a ratio of a flow rate of the $NH_3$ gas to a total gas flow rate is in a range of 10 to 99.99% and preferably in a range of 90 to 99.9%, and a ratio of a flow rate of the $Si_2H_6$ gas to a total gas flow rate is in a range of 0.001 to 10% and preferably in a range of 0.01 to 10%. At this time, a ratio of the flow rates of the $Si_2H_6$ gas and the $NH_3$ gas (the flow rate of the $Si_2H_6$ gas to the flow rate of the $NH_3$ gas) is preferably in a range of 0.015 to 0.2 in order to increase the amount of charges trapped in the silicon nitride film, to increase a write speed and an erase speed, and to improve charge holding performance. Also, under the conditions where a flow rate of the rare gas is in a range of 20 to 2000 mL/min (sccm) and preferably in a range of 200 to 1000 mL/min (sccm), a flow rate of the $NH_3$ gas is in a range of 20 to 1000 mL/min (sccm) and preferably in a range of 200 to 800 mL/min (sccm), and a flow rate of the $Si_2H_6$ gas is in a range of 0.5 to 50 mL/min (sccm) and preferably in a range of 0.5 to 10 mL/min (sccm), the ratio of the flow rates above may be set.

Also, when a $N_2$ gas is used as the nitrogen-containing gas and a silane-based gas, such as a $Si_2H_6$ gas, is used as the silicon-containing gas, the processing pressure is preferably in a range of 1 to 1333 Pa, and more preferably in a range of 1 to 133 Pa. Also, in this case, a ratio of a flow rate of the $N_2$ gas to a total gas flow rate is in a range of 10 to 99.99% and preferably in a range of 90 to 99.9%, and a ratio of a flow rate of the $Si_2H_6$ gas to a total gas flow rate is in a range of 0.01 to 90% and preferably in a range of 0.1 to 10%. At this time, a ratio of the flow rates of the $Si_2H_6$ gas and the $N_2$ gas (the flow rate of the $Si_2H_6$ gas to the flow rate of the $N_2$ gas) is preferably in a range of 0.01 to 0.2 in order to increase the amount of charges trapped in the silicon nitride film, to increase a write speed and an erase speed, and to improve charge holding performance. Also, under the conditions where a flow rate of the rare gas is in a range of 20 to 3000 mL/min (sccm) and preferably in a range of 200 to 1000 mL/min (sccm), a flow rate of the $N_2$ gas is in a range of 20 to 3000 mL/min (sccm) and preferably in a range of 200 to 2000 mL/min (sccm), and a flow rate of the $Si_2H_6$ gas is in a range of 0.5 to 50 mL/min (sccm) and preferably in a range of 0.5 to 10 mL/min (sccm), the ratio of the flow rates above may be set.

Also, in the above cases, as a processing temperature of the plasma CVD, a temperature of the holding stage 2 is equal to or greater than 300° C., and preferably in a range of 400 to 600° C.

Silicon nitride films having different band-gaps may be alternately deposited by alternately performing plasma CVD processing alternately under the conditions for having larger the band-gap and under the conditions for having smaller the band-gap. In particular, since a magnitude of a band-gap may be easily controlled with high precision by using only a processing pressure, films can be continuously formed when a laminate of silicon nitride films having different band-gaps is to be formed, thereby improving process efficiency.

Also, since a band-gap of a silicon nitride film may be easily adjusted with high precision by adjusting only a processing pressure, dielectric film laminates having various band-gap structures may be simply manufactured. Accordingly, the present invention may be suitably used for a process for manufacturing a MOS memory device having excellent data holding characteristics, high-speed data rewrite performance, low-power operation, and high reliability.

Figure 6:
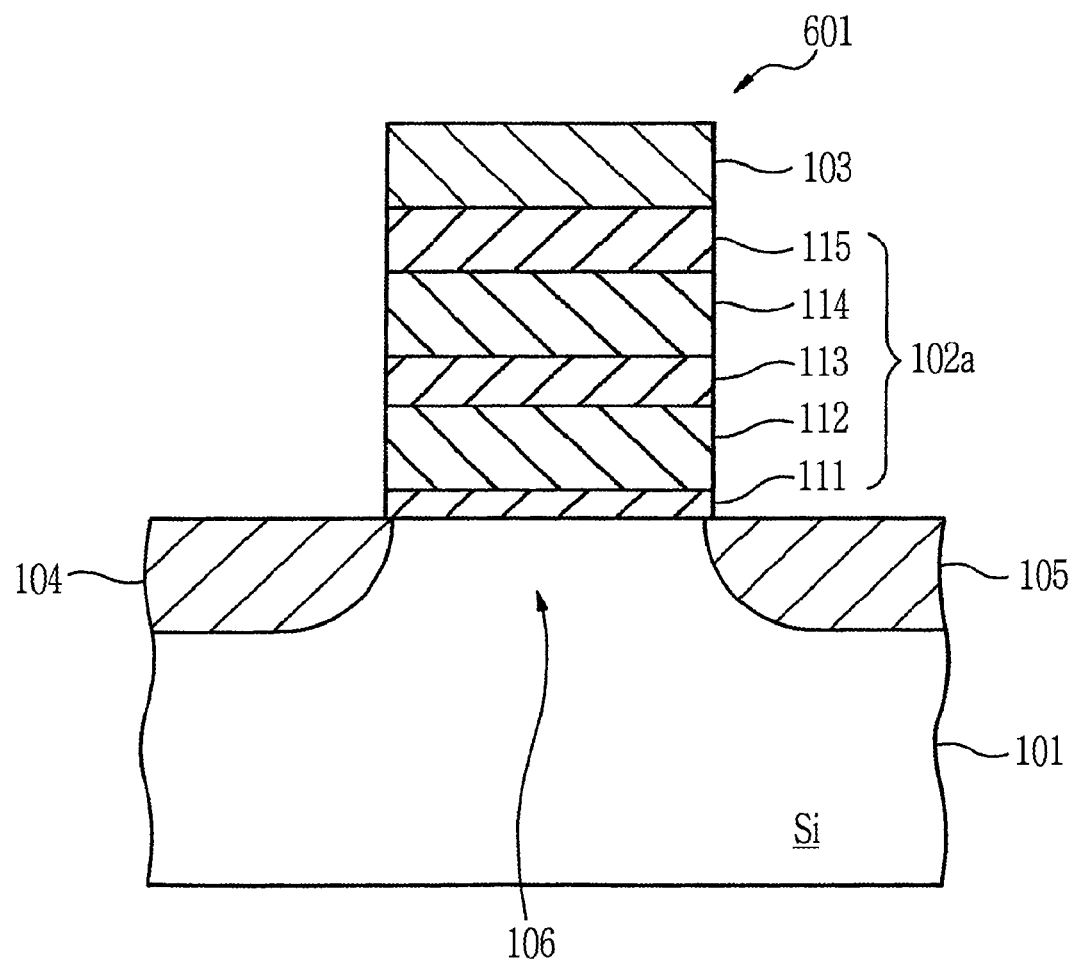
FIG. 6 is a schematic view for explaining a configuration of a MOS memory device to which a manufacturing method according to a first embodiment of the present invention is applicable.
Figure 7:
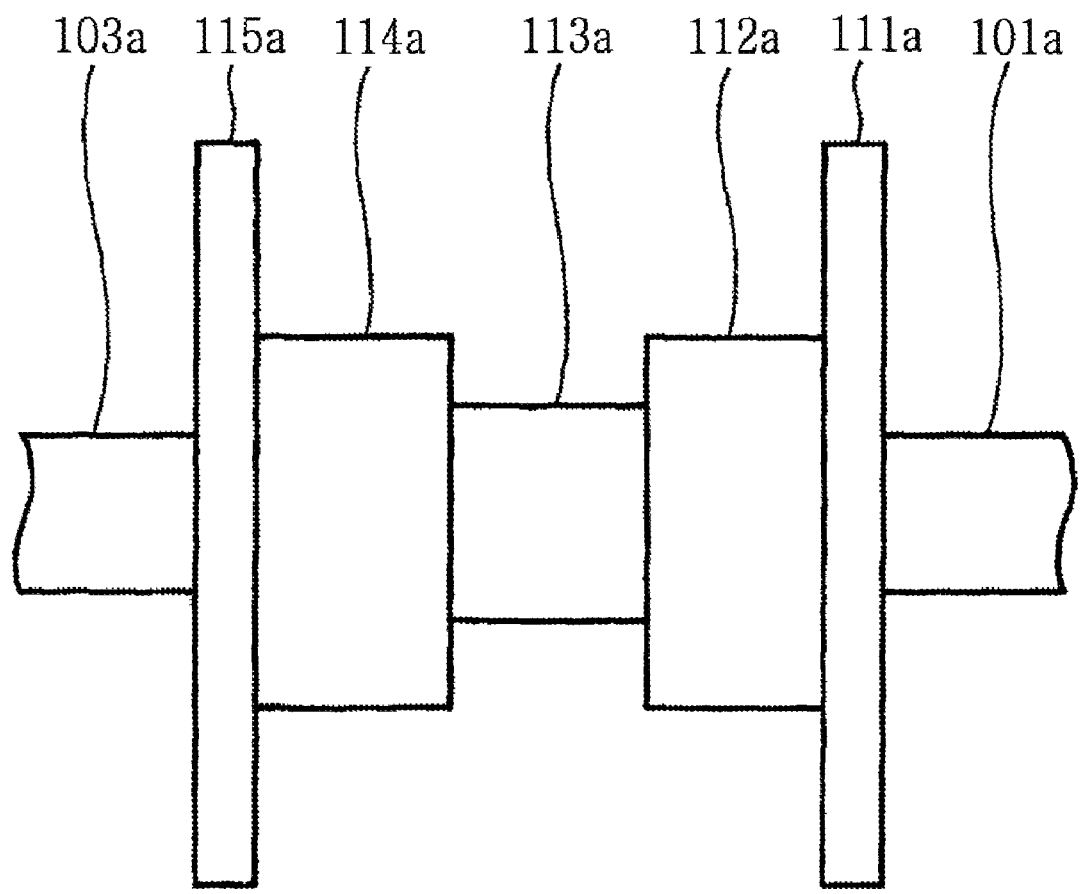
FIG. 7 shows an energy band of the MOS memory device of FIG. 6

Now, a method for manufacturing the MOS memory device according to the present embodiment will be explained with reference to FIGS. 6 and 7. FIG. 6 is a cross-sectional view schematically showing a configuration of a MOS memory device 601 to which a method for manufacturing the MOS memory device according to the first embodiment of the present invention is applicable. FIG. 7 shows an example of an energy band of the MOS memory device 601 of FIG. 6.

As shown in FIG. 6, the MOS memory device 601 includes a p-type silicon substrate 101 that is a semiconductor layer, a dielectric film laminate 102a which is stacked and formed on the p-type silicon substrate 101 and includes a plurality of dielectric films having band-gaps of different magnitudes, and a gate electrode 103 formed on the dielectric film laminate 102a. The dielectric film laminate 102a including a first dielectric film 111, a second dielectric film 112, a third dielectric film 113, a fourth dielectric film 114, and a fifth dielectric film 115 is formed between the silicon substrate 101 and the gate electrode 103. A first source/drain 104 and a second source/drain 105 are formed as n-type diffusion layers to a predetermined depth from a surface in the silicon substrate 101 to be located at both sides of the gate electrode 103. A channel forming region 106 is formed between the first source/drain 104 and the second source/drain 105. The MOS memory device 601 may be formed in a p-well or p-type silicon layer formed in a semiconductor substrate. Also, although an n-channel MOS device is exemplarily explained in the present embodiment, a p-channel MOS device may be used. Accordingly, the following content about the present embodiment may apply to both an n-channel MOS device and a p-channel MOS device. Also, although not shown, a source/drain electrode is formed in the source/drain 104 and 105 as is well known, and thus potentials of the regions may be controlled from the outside.

The first dielectric film 111 is, for example, a silicon dioxide film ($SiO_2$ film) that is formed by oxidizing the surface of the silicon substrate 101 by using thermal oxidation method. The first dielectric film 111 has a largest energy band-gap, for example, in a range of 8 to 10 eV. A thickness of the first dielectric film 111 is preferably, for example, in a range of 0.5 nm to 20 nm, more preferably in a range of 1 nm to 10 nm, and yet more preferably in a range of 1 nm to 3 nm.

The second dielectric film 112 is a silicon nitride film (SiN film; a composition ratio of Si and N is not necessarily stoichimetrically determined and may vary according to film formation conditions, throughout the specification) formed on a surface of the first dielectric film 111. The second dielectric film 112 has an energy band-gap of, for example, 5 to 7 eV. A thickness of the second dielectric film 112 is preferably in a range of, for example, 2 nm to 20 nm, more preferably in a range of 2 nm to 10 nm, and yet more preferably in a range of 3 nm to 5 nm.

The third dielectric film 113 is a silicon nitride film formed on the second dielectric film 112. The third dielectric film 113 has an energy band-gap of, for example, 2.5 to 4 eV. A thickness of the third dielectric film 113 is preferably in a range of, for example, 2 nm to 30 nm, more preferably in a range of 2 nm to 15 nm, and yet more preferably in a range of 4 nm to 10 nm.

The fourth dielectric film 114 is a silicon nitride film (SiN film) formed on the third dielectric film 113. The fourth dielectric film 114 may have the same energy band-gap and the same thickness as those of the second dielectric film 112.

The fifth dielectric film 115 is a silicon dioxide film ($SiO_2$ film) that is deposited on the fourth dielectric film 114 by, for example, CVD (Chemical-Vapor-Deposition) method. The fifth dielectric film 115 functions as a blocking layer (barrier layer) between the electrode 103 and the fourth dielectric film 114. The fifth dielectric film 115 has an energy band-gap of, for example, 8 to 10 eV. A thickness of the fifth dielectric film 115 is preferably in a range of, for example, 2 nm to 30 nm, more preferably in a range of 2 nm to 15 nm, and yet more preferably in a range of 5 nm to 8 nm.

The gate electrode 103 is formed of a polycrystalline silicon film formed by, for example, CVD method, and functions as a control gate (CG) electrode. Also, the gate electrode 103 may be a film including a metal such as W, Ti, Ta, Cu, Al, Au, Pt, or the like. The gate electrode 103 is not limited to a single-layer structure, and may have a multi-layer structure including tungsten, molybdenum, tantalum, titanium, platinum, silicide thereof, nitride, an alloy, or the like in order to reduce the resistivity of the gate electrode 103 and increase a speed. The gate electrode 103 is connected to a wiring layer that is now shown.

In the MOS memory device 601 according to the present embodiment, it is preferable that a silicon nitride-oxide (SiON film) or a silicon dioxide film ($SiO_2$ film) is used as the first dielectric film 111 and the fifth dielectric film 115. Also, the second dielectric film 112, the third dielectric film 113, and the fourth dielectric film 114 are formed of silicon nitride.

As shown in FIG. 7, the MOS memory device 601 has an energy band structure in which band-gaps 111a and 115a of the first dielectric film 111 and the fifth dielectric film 115 are larger than band-gaps 112a, 113a, and 114a of the second dielectric film 112, the third dielectric film 113, and the fourth dielectric film 114 which constitute an intermediate laminate interposed between the first dielectric film 111 and the fifth dielectric film 115. Also, the second dielectric film 112 and the fourth dielectric film 114 having the band-gaps 112a and 114a, which are medium-sized band-gaps, are interposed between the first dielectric film 111 and the third dielectric film 113 having the smallest band-gap and between the fifth dielectric film 115 and the third dielectric film 113. Reference numeral 101a in FIG. 7 denotes a band-gap of the silicon substrate 101 and reference numeral 103a denotes a band-gap of the gate electrode 103. Since the MOS memory device 601 has such an energy band structure, during a data write operation, charges easily move through the first dielectric film 111, thereby increasing a write operation speed, and reducing a write voltage necessary to inject charges into the dielectric film laminate 102a.

In the dielectric film laminate 102a, charges tend to accumulate on a region around the third dielectric film 113 having the smallest band-gap. Meanwhile, once charges are held in the region around the third dielectric film 113, an energy barrier is increased due to the existence of the second dielectric film 112 and fourth dielectric film 114, which are adjacent to the third dielectric film 113, thereby preventing charges from leaking out through the first dielectric film 111 or the fifth dielectric film 115. Accordingly, even though a thickness of the first dielectric film 111 or the fifth dielectric film 115 is not large, charges may be stably held in the dielectric film laminate 102a, thereby achieving excellent data holding characteristics.

An example of an operation of the MOS memory device 601 structured as described above will now be explained. Initially, during a data write operation, based on a potential of the silicon substrate 101, the first source/drain 104 and the second source/drain 105 are held at 0 V, and a predetermined plus voltage is applied to the gate electrode 103. At this time, electrons are accumulated in the channel forming region 106 to form an inversion layer, and some of charges in the inversion layer move to the dielectric film laminate 102a through the first dielectric film 111 due to tunneling effect. The electrons having moved to the dielectric film laminate 102a are trapped in the center of a charge trap region formed in the dielectric film laminate 102a, to accumulate data.

During a data read operation, based on a potential of the silicon substrate 101, a voltage of 0 V is applied to one of the first source/drain 104 and the second source/drain 105 and a predetermined voltage is applied to the other. Also, a predetermined voltage is applied to the gate electrode 103. By applying the voltage as such, the amount of channel current or a drain voltage is changed according to whether charges are accumulated or the amount of accumulated charges in the dielectric film laminate 102a. Accordingly, data can be read to the outside by detecting a change in the channel current or the drain voltage.

During a data erase operation, based on a potential of the silicon substrate 101, a voltage of 0 V is applied to the first source/drain 104 and the second source/drain 105, and a predetermined negative voltage is applied to the gate electrode 103. By applying these voltages, charges held in the dielectric film laminate 102a leak to the channel forming region 106 of the silicon substrate 101 through the first dielectric film 111. Accordingly, the MOS memory device 601 returns to an erase state where the amount of electrons accumulated in the dielectric film laminate 102a is small.

Also, a method for writing, reading, and erasing information in the MOS memory device 601 is not limited, and write, read, and erase operations may be performed in a manner different from that described above. For example, information write, read, and erase operations may be performed by using physical phenomena such as FN tunneling effect, hot electron injection, hot hole injection, photoelectric effect, and the like. Also, information of 2 bits or more may be written to and read from one memory cell by enabling the first source/drain 104 and the second source/drain 105 to alternately function as a source and a drain without fixing the roles of the first source/drain 104 and the second source/drain 105.

As described above, the MOS memory device 601 is a MOS memory device having improved data holding characteristics, increased write operation speed, reduced power consumption, and improved reliability, compared to a conventional MOS memory device.

Figure 8A:
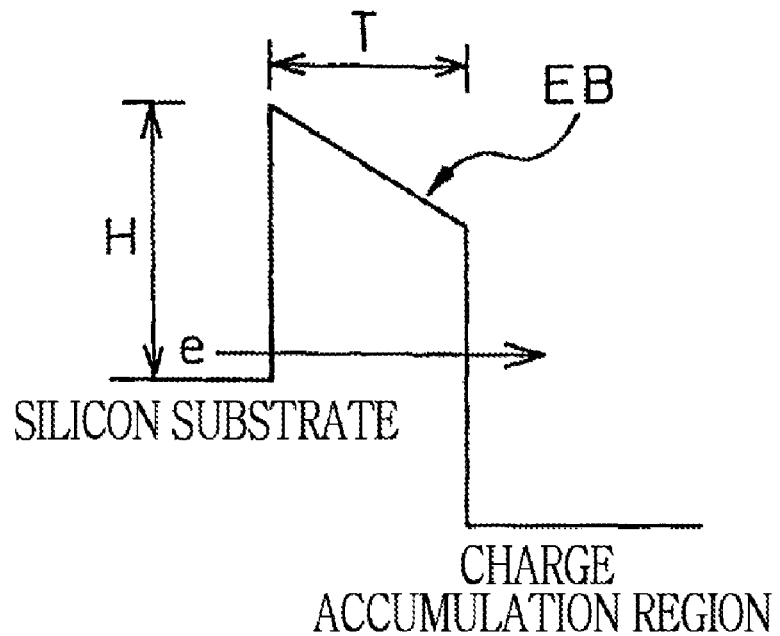
FIGS. 8A through 8C show energy diagrams in a conventional art.
Figure 8B:
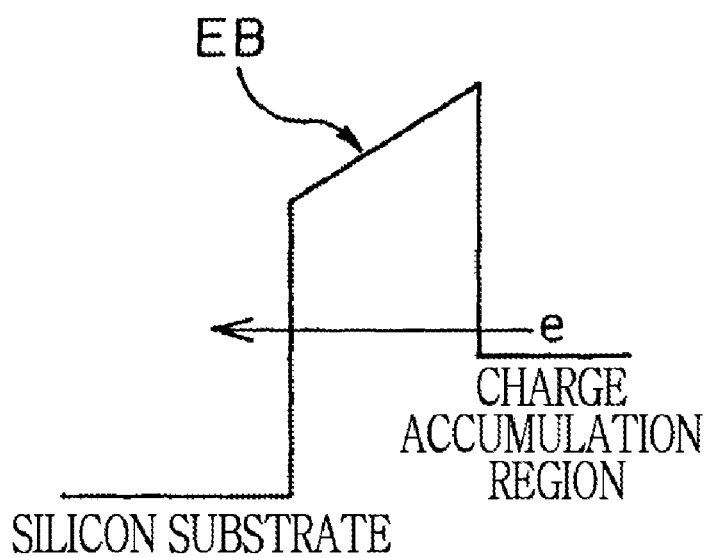
Figure 8C:
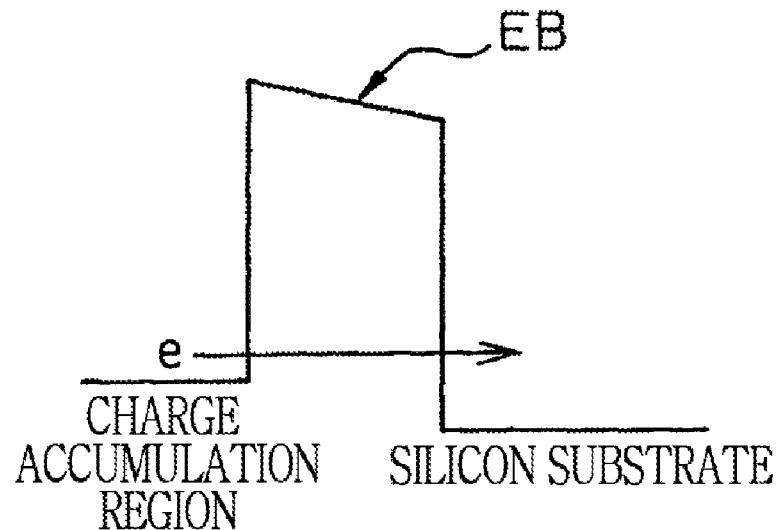
Figure 8D:
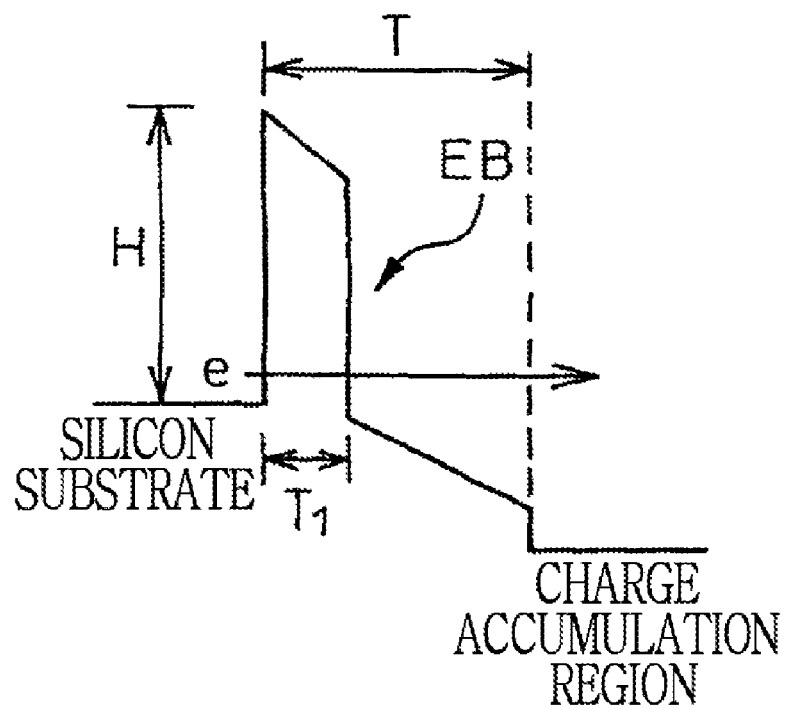
FIGS. 8D through 8F show energy diagrams according to the present invention.
Figure 8E:
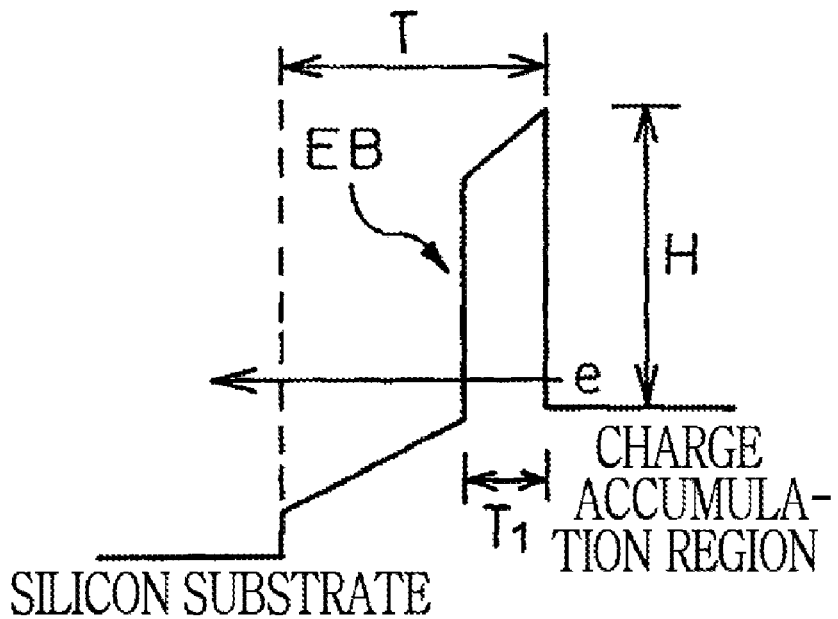
Figure 8F:
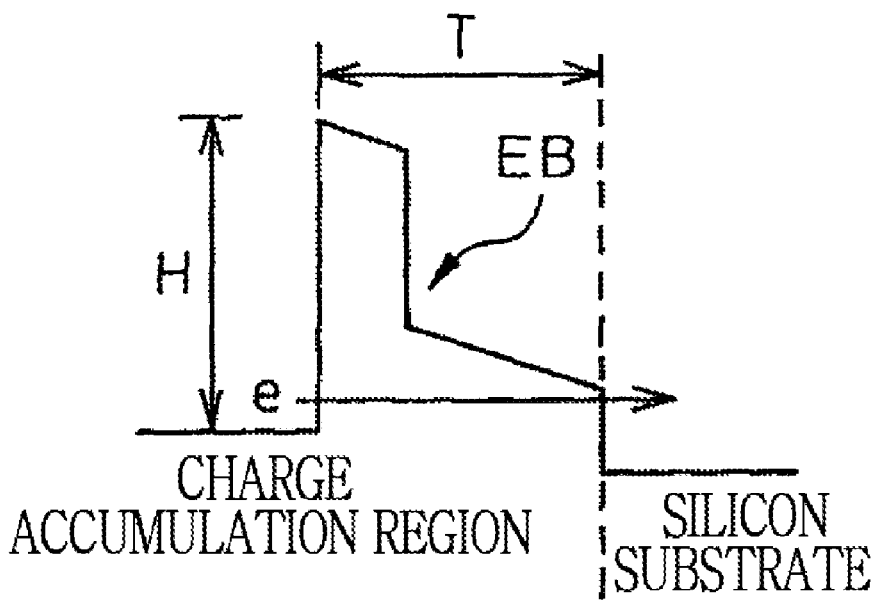

Here, an operation of the MOS memory device of the above embodiment will be explained with reference to FIGS. 8A through 8F. FIGS. 8A through 8C schematically show an energy diagram of a conventional MOS memory device, respectively, during a write operation, during an erase operation, and in a data holding state. Also, FIGS. 8D through 8F schematically show an energy diagram of the MOS memory device of the present invention, respectively, during a write operation, during an erase operation, and in a data holding state. Also, in the MOS memory device 601, although charges are held in a certain distribution between the first dielectric film and the fifth dielectric film, since mainly in a portion in the third dielectric film or around interfaces of the third dielectric film, charges accumulate, the portion is referred to as the charge accumulation region in FIGS. 8A through 8F.

A probability that electrons move between the silicon substrate and the charge accumulation region is inversely proportional to a magnitude of an energy barrier EB (that is, a height H and a width T of the energy barrier EB). If a band-gap of the first dielectric film is increased, since the height H of the energy barrier EB is increased, movement of electrons between the silicon substrate side and the charge accumulation region side is limited. Also, if a thickness of the first dielectric film is increased, since the width T is increased, the energy barrier EB is also increased. As such, to increase a thickness of the first dielectric film is an effective way of preventing electrons held in the charge accumulation region side from leaking out to the silicon substrate side through the first dielectric film. Accordingly, in the MOS memory device, in order to improve charge holding performance, the height H and the width T of the energy barrier EB due to the first dielectric film may be set large by increasing the band-gap and the thickness of the first dielectric film as shown in FIG. 8C.

However, if the thickness of the first dielectric film is increased, since, for example, it is also difficult to inject electrons into the charge accumulation region from the silicon substrate due to tunneling effect during the write operation, a high write voltage should be applied during the write operation, as shown in FIG. 8A. Also, an erase voltage is necessary even during the erase operation as shown in FIG. 8B. In order to reduce the write voltage and the erase voltage, the band-gap and the thickness of the first dielectric film should be reduced. However, if so, since the energy barrier EB is also reduced, data holding characteristics are degraded.

In the present invention, as shown in the first embodiment and as will be shown in the second and third embodiments, the second and fourth dielectric films having smaller band-gaps are formed adjacent to the first dielectric film and the fifth dielectric films having larger band-gaps. Since such an energy band structure is employed, as shown in FIG. 8D, during the write operation, when electrons move from the silicon substrate side to the charge accumulation region by passing through the first dielectric film having the large band-gap, a width of the energy barrier EB becomes $T_1$ corresponding to the first dielectric film, thereby enabling the electrons to smoothly move even at a low write voltage. Even during the erase operation, as shown in FIG. 8E, a width of the energy barrier EB when electrons passes through the silicon substrate side from the charge accumulation region side becomes $T_1$, thereby enabling the electrons to smoothly move even at a low erase voltage. Also, although not shown, the same goes when getting electrons to leak out to the gate electrode 103 side through the fifth dielectric film from the charge accumulation region. Meanwhile, as shown in FIG. 8F, in the state where electrons are held in the charge accumulation region, since the energy barrier EB includes not only the first dielectric film (fifth dielectric film) but also the second dielectric film (fourth dielectric film), the width T is increased. Accordingly, even though a thickness of the first dielectric film (fifth dielectric film) is not increased, charges are prevented from leaking out from the charge accumulation region, thereby achieving excellent charge holding characteristics.

Next, a method for manufacturing the MOS memory device according to the present embodiment will be explained by explaining a case where the MOS memory device 601 is manufactured, as an example. Here, only representative order of processes will be exemplarily explained. Initially, the silicon substrate 101 on which an isolation film (not shown) is formed by a method such as LOCOS (Local-Oxidation-of-Silicon) method, STI (Shallow-Trench-Isolation) method, or the like is prepared, and the first dielectric film 111 is formed on the surface of the silicon substrate 101 by, for example, thermal oxidation method.

Next, the second dielectric film 112, the third dielectric film 113, and the fourth dielectric film 114 are sequentially formed by plasma CVD method by using the plasma processing device 100 on the first dielectric film 111. When the second dielectric film 112 is to be formed, plasma CVD is performed under conditions where a band-gap of the second dielectric film 112 is smaller than that of the first dielectric film 111. When the third dielectric film 113 is to be formed, plasma CVD is performed under conditions where a band-gap of the third dielectric film 113 is smaller than that of the second dielectric film 112. When the fourth dielectric film 114 is to be formed, plasma CVD is performed under conditions where a band-gap of the fourth dielectric film 114 is larger than that of the third dielectric film 113. Also, in the present embodiment, dielectric films are formed under the same plasma CVD conditions so that the second dielectric film 112 and the fourth dielectric film 114 have band-gaps of the same magnitude. However, the magnitudes of the band-gaps 112a and 114a of the second dielectric film 112 and the fourth dielectric film 114 may be the same as or different from each other. A magnitude of a band-gap of each film may be controlled by changing only pressure conditions of plasma CVD processing as described above.

Next, the fifth dielectric film 115 is formed on the fourth dielectric film 114 to have a band-gap larger than that of the fourth dielectric film 114. The fifth dielectric film 115 may be formed by, for example, CVD method. Also, a metal film to become the gate electrode 103 is formed, by forming a polysilicon layer, a metal layer, a metal silicide layer, the like on the fifth dielectric film 115 by, for example, CVD method.

Next, the metal film and the fifth through first dielectric films 115 through 111 are etched by photolithography using a resist with a pattern as a mask to obtain a gate laminate structure having the dielectric film laminate 102a and the gate electrode 103 having the pattern. Next, n-type impurities are heavily injected by ion implantation into a surface of silicon adjacent to both sides of the gate laminate structure, to form the first source/drain 104 and the second source/drain 105. As such, the MOS memory device 601 structured as described in FIG. 6 may be manufactured.

Second Embodiment

Now, a method for manufacturing a MOS memory device according to a second embodiment of the present invention will be explained with reference to FIGS. 9 and 10. The method for manufacturing the MOS memory device of the present invention may be used to manufacture, for example, a MOS memory device 602 shown in FIG. 9. FIG. 10 shows an energy band of the MOS memory device 602 of FIG. 9.

Figure 9:
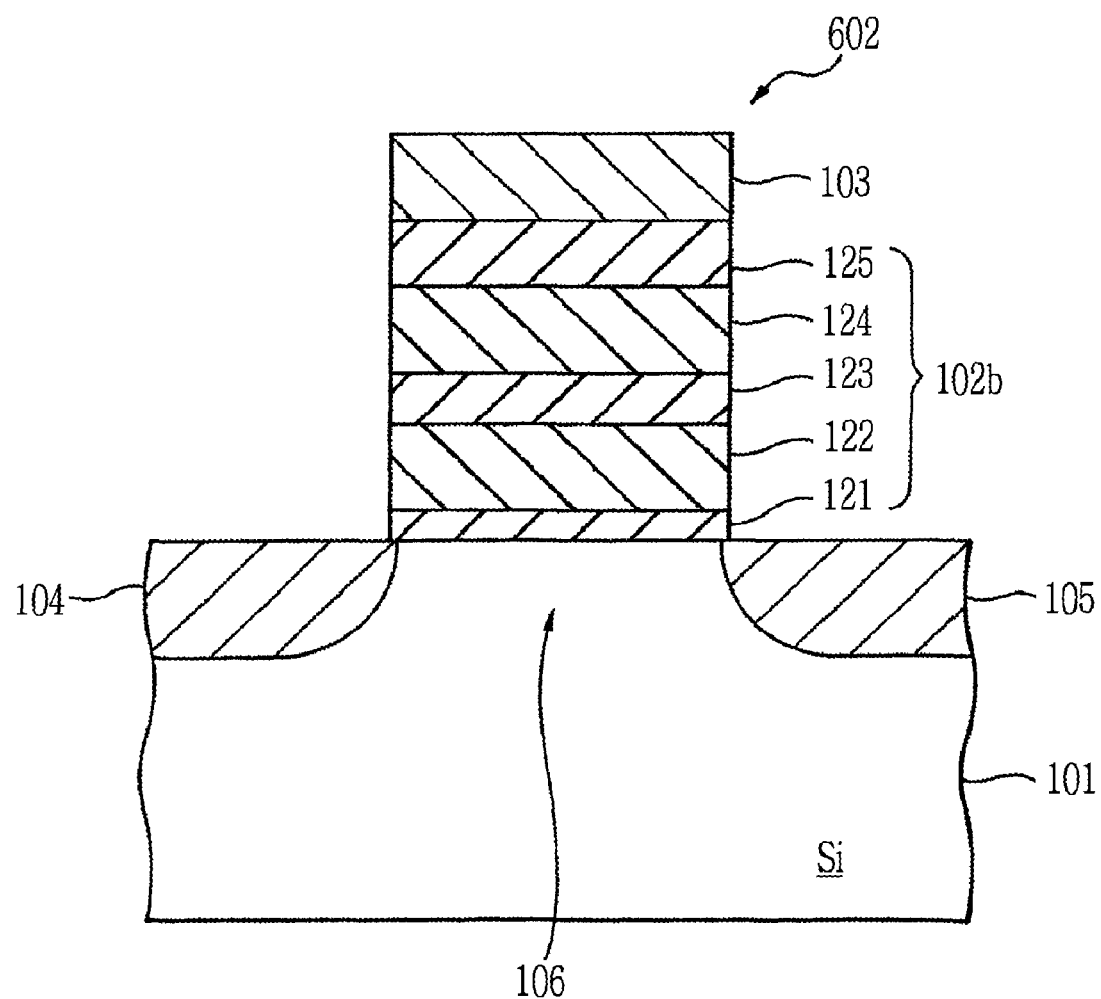
FIG. 9 is a schematic view for explaining a configuration of a MOS memory device to which a manufacturing method according to a second embodiment of the present invention is applicable.
Figure 10:
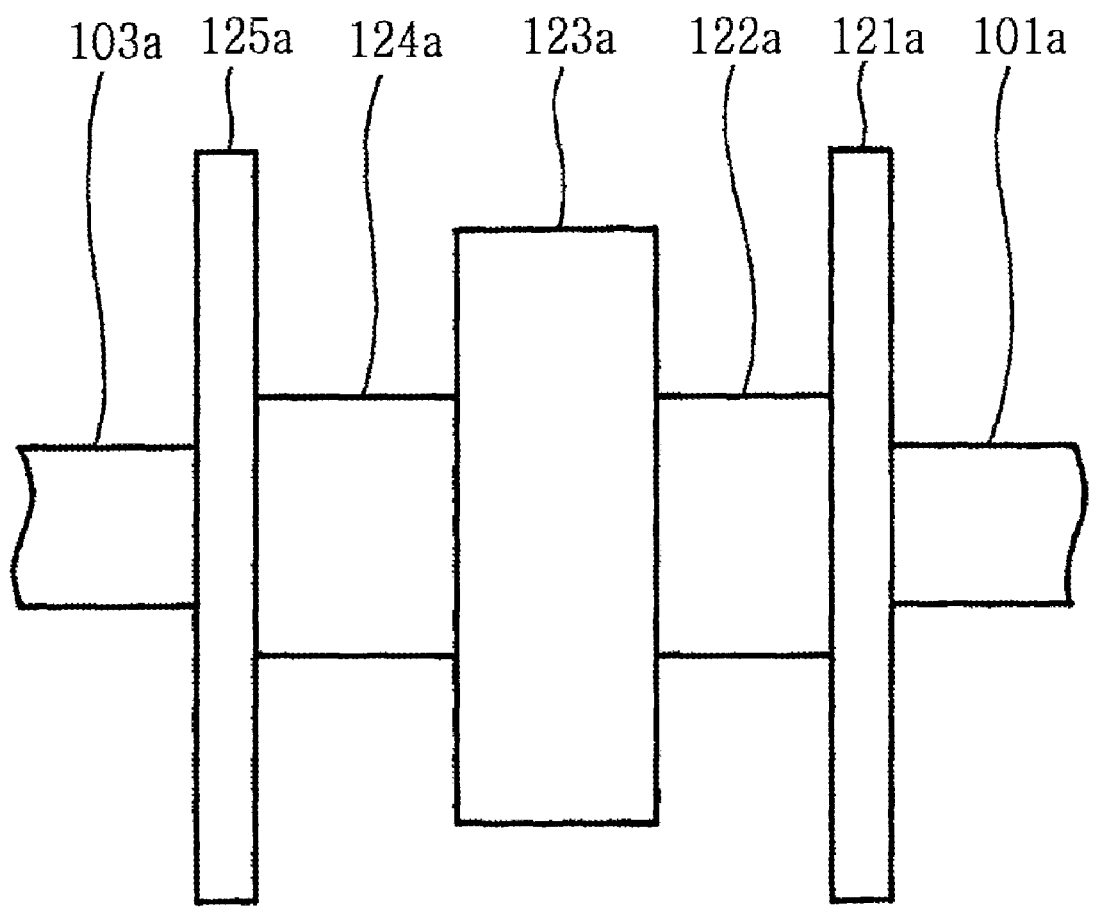
FIG. 10 shows an energy band of the MOS memory device of FIG. 9.

As shown in FIG. 9, the MOS memory device 602 includes the p-type silicon substrate 101 that is a semiconductor layer, a dielectric film laminate 102b including a plurality of dielectric films which are formed on the p-type silicon substrate 101 and have band-gaps of different magnitudes, and the gate electrode 103 formed on the dielectric film laminate 102b. The dielectric film laminate 102b including a first dielectric film 121, a second dielectric film 122, a third dielectric film 123, a fourth dielectric film 124, and a fifth dielectric film 125 is formed between the silicon substrate 101 and the gate electrode 103. The first source/drain 104 and the second source/drain 105 are formed as n-type diffusion layers to a predetermined depth from a surface in the silicon substrate 101 to be located at both sides of the gate electrode 103, and the channel forming region 106 is formed between the first source/drain 104 and the second source/drain 105. Also, the MOS memory device 602 may be formed in a p-well or p-type silicon layer formed in a semiconductor substrate. Also, although an n-channel MOS device is exemplarily explained in the present embodiment, a p-channel MOS device may be used. Accordingly, the following content about the present embodiment may be applied to both an n-channel MOS device and a p-channel MOS device.

In the MOS memory device 602 according to the present embodiment, the first dielectric film 121, the fifth dielectric film 125, and the gate electrode 103 have the same configurations as the first dielectric film 111, the fifth dielectric film 115, and the gate electrode 103 of the MOS memory device 601 of FIG. 1, and thus an explanation thereof will not be given.

The second dielectric film 122 is a silicon nitride film (SiN film) formed on the first dielectric film 121. The second dielectric film 122 has an energy band-gap of, for example, 2.5 to 4 eV. A thickness of the second dielectric film 122 is preferably in a range of, for example, 2 nm to 20 nm, more preferably in a range of 2 nm to 10 nm, and yet more preferably in a range of 3 nm to 5 nm.

The third dielectric film 123 is a silicon nitride film (SiN film) formed on the second dielectric film 122. The third dielectric film 123 has an energy band-gap of, for example, 5 to 7 eV. A thickness of the third dielectric film 123 is preferably in a range of, for example, 2 nm to 30 nm, more preferably in a range of 2 nm to 15 nm, and yet more preferably in a range of 4 nm to 10 nm.

The fourth dielectric film 124 is a silicon nitride film (SiN film) formed on the third dielectric film 123. The fourth dielectric film 124 has the same energy band and the same thickness as those of the second dielectric film 122.

As shown in FIG. 10, the MOS memory device 602 has an energy band structure in which band-gaps 121a and 125a of the first dielectric film 121 and the fifth dielectric film 125 are larger than band-gaps 122a, 123a, and 124a of the second dielectric film 122, the third dielectric film 123, and the fourth dielectric film 124 which constitute an intermediate laminate interposed between the first dielectric film 121 and the fifth dielectric film 125. Also, the second dielectric film 122 and the fourth dielectric film 124 having the smallest band-gaps 122a and 124a are disposed adjacent to the first dielectric film 121 and the fifth dielectric film 125. Additionally, the third dielectric film 123 having the band-gap 123a, which is a medium-sized band-gap, that is, a band-gap smaller than the band-gaps 121a and 125a and larger than the band-gaps 122a and 124a, is disposed between the second dielectric film 122 and the fourth dielectric film 124. That is, the second dielectric film 122 and the fourth dielectric film 124 having the smallest band-gaps are interposed between the first dielectric film 121 having the largest band-gap 121a and the third dielectric film 123 having the medium-sized band-gap 123a and between the fifth dielectric film 125 having the largest band-gap 125a and the third dielectric film 123. Since the MOS memory device 602 has such an energy band structure, charges easily move due to tunneling effect through the first dielectric film 121 during a data write operation, thereby increasing a write operation speed and reducing a write voltage necessary to inject charges into the dielectric film laminate 102b.

In the dielectric film laminate 102b, charges tend to accumulate around interfaces between the third dielectric film 123 and the second dielectric film 122 having the small band-gap and between the third dielectric film 123 and the fourth dielectric film 124 having the small band-gap. Meanwhile, once charges are held around the interface, an energy barrier is increased due to the existence of the second dielectric film 122 and the fourth dielectric film 124, thereby preventing charges from leaking out through the first dielectric film 121 or the fifth dielectric film 125. Accordingly, even though the thickness of the first dielectric film 121 and the fifth dielectric film 125 is not large, charges may be stably held in the dielectric film laminate 102b, thereby achieving excellent data holding characteristics.

Accordingly, the MOS memory device 602 is a MOS memory device having improved data holding characteristics, increased write operation speed, reduced power consumption, and improved reliability, compared to the conventional MOS memory device.

Write, read, and erase operations of the MOS memory device 602 according to the present embodiment may be performed in the same manner as those in the first embodiment.

The MOS memory device 602 may be manufactured in the same manner as that used in the first embodiment except that the dielectric film laminate 102b is formed in the following order. In the present embodiment, the second dielectric film 122, the third dielectric film 123, and the fourth dielectric film 124 which act mainly as a charge accumulation region are formed by a plasma CVD method using the plasma processing device 100. That is, the second dielectric film 122, the third dielectric film 123, and the fourth dielectric film 124 are sequentially formed on the first dielectric film 121 by plasma CVD method by using the plasma processing device 100. When the second dielectric film 122 is to be formed, plasma CVD is performed under conditions where a band-gap of the second dielectric film 122 is smaller than that of the first dielectric film. When the third dielectric film 123 is to be formed, plasma CVD is performed under conditions where a band-gap of the third dielectric film 123 is larger than that of the second dielectric film 122 and smaller than that of the first dielectric film 121. When the fourth dielectric film 124 is to be formed, plasma CVD is performed under conditions that a band-gap of the fourth dielectric film 124 is smaller than that of the third dielectric film 123. Also, in the present embodiment, dielectric films are formed under the same plasma CVD conditions so that the second dielectric film 122 and the fourth dielectric film 124 have the band-gap of the same magnitude. However, the band-gaps 122a and 124a of the second dielectric film 122 and the fourth dielectric film 124 may be the same as or different from each other. A magnitude of a band-gap may be controlled by changing only pressure conditions of plasma CVD processing as described above.

Third Embodiment

Figure 12:
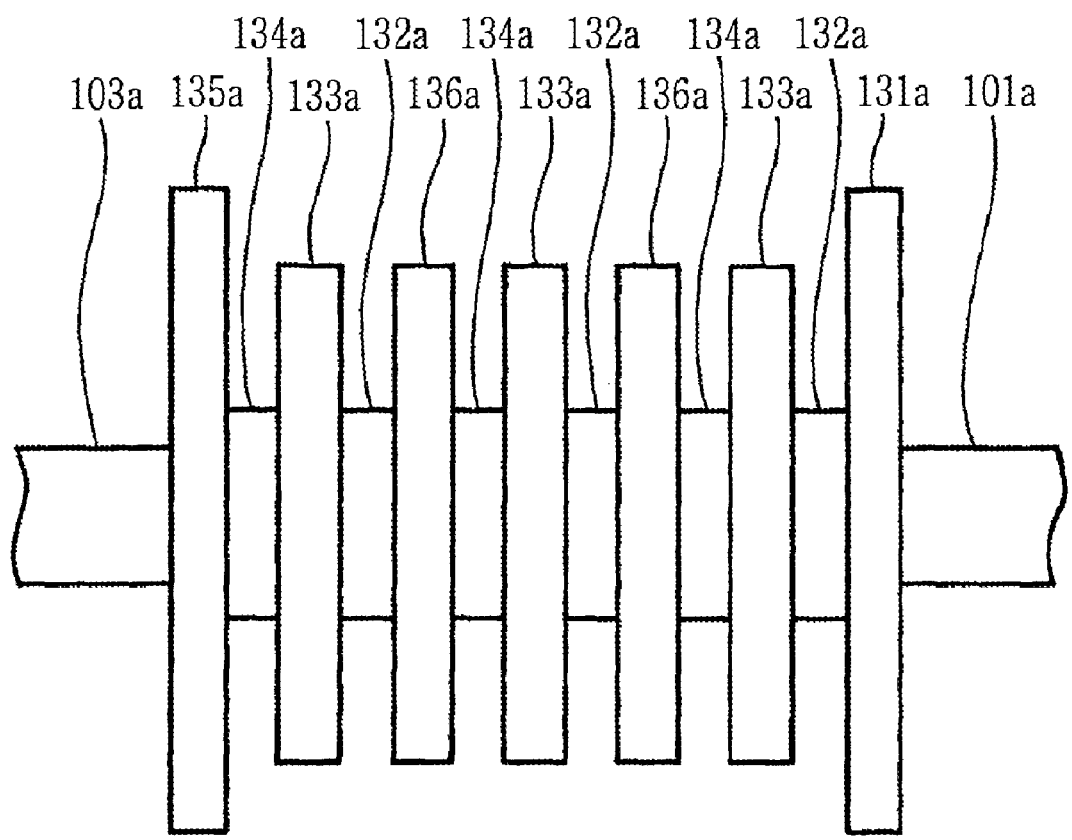
FIG. 12 shows an example of an energy band of the MOS memory device of FIG. 11.
Figure 13:
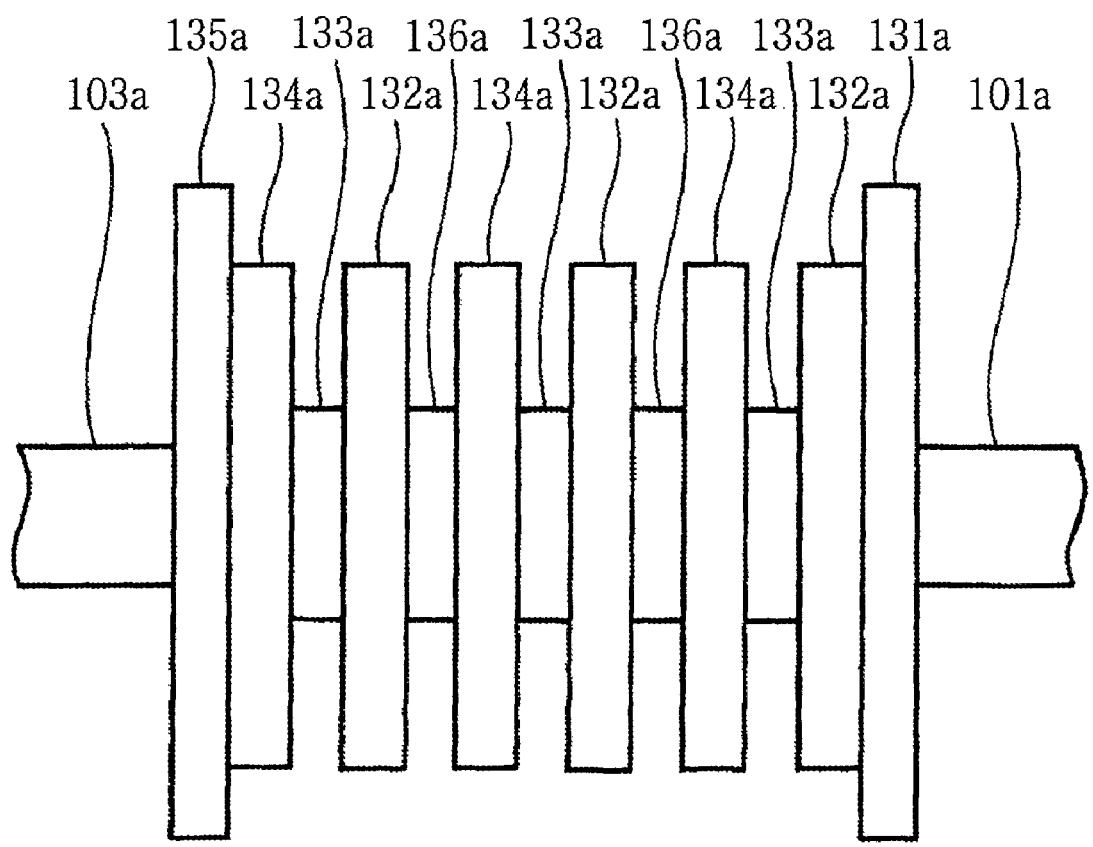
FIG. 13 shows another example of the energy band of the MOS memory device of FIG. 11.

Now, a method for manufacturing a MOS memory device according to a third embodiment of the present invention will be explained with reference to FIGS. 11 and 12. The method for manufacturing the MOS memory device of the present invention can be used to manufacture, for example, a MOS memory device 603 of a structure shown in FIG. 11. FIG. 12 shows an example of an energy band of the MOS memory device 603 of FIG. 11. FIG. 13 shows another example of the energy band of the MOS memory device of FIG. 11.

Figure 11:
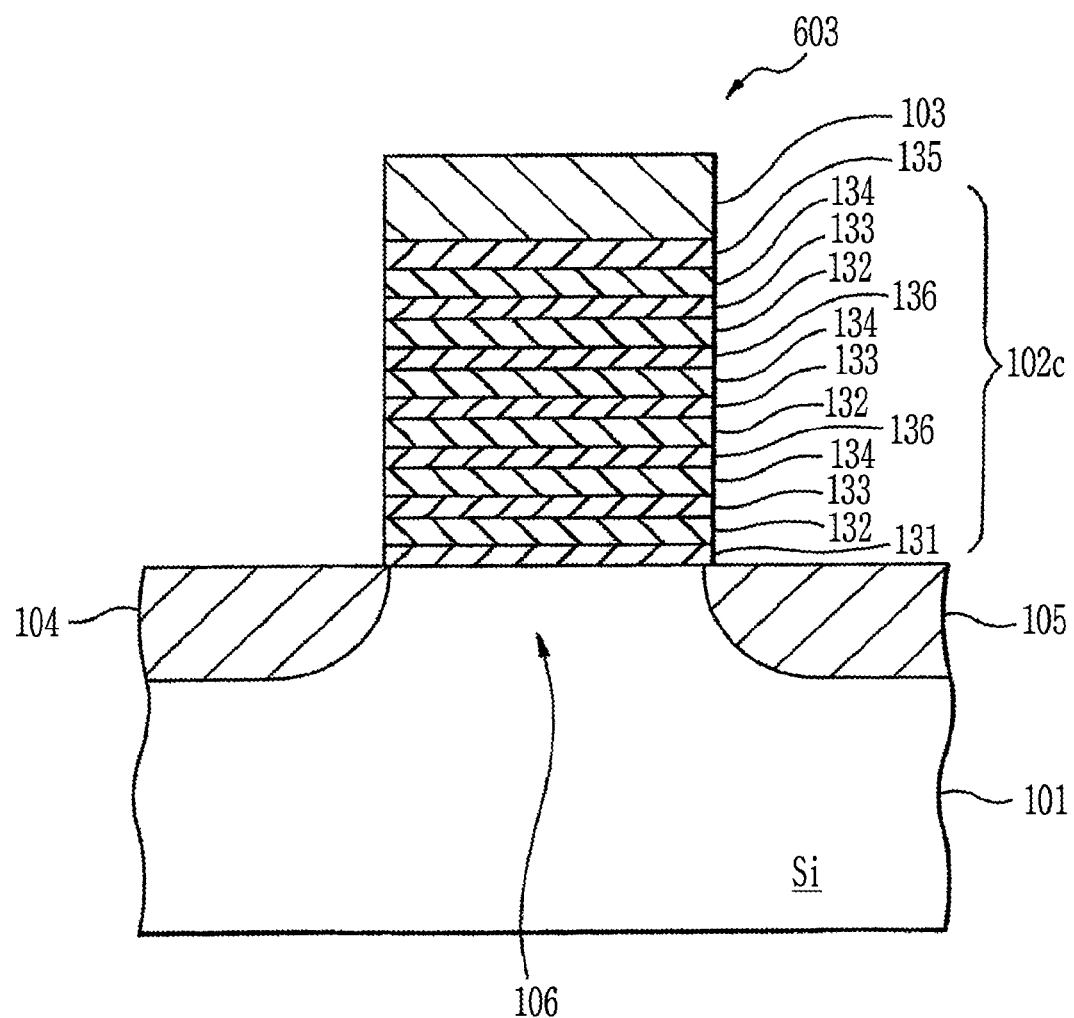
FIG. 11 is a schematic view for explaining a configuration of a MOS memory device to which a manufacturing method according to a third embodiment of the present invention is applicable.

As shown in FIG. 11, a MOS memory device 603 includes the p-type silicon substrate 101 that is a semiconductor layer, a dielectric film laminate 102c which is formed on the p-type silicon substrate 101 and includes a plurality of dielectric films having band-gaps of different magnitudes, and the gate electrode 103 formed on the dielectric film laminate 102c. The dielectric film laminate 102c is formed between the silicon substrate 101 and the gate electrode 103, and the dielectric film laminate 102c includes a first dielectric film 131, a second dielectric film 132, a third dielectric film 133, a fourth dielectric film 134, a fifth dielectric film 135, and a spacer dielectric film 136. In the dielectric film laminate 102c, a laminate of the second dielectric film 132, the third dielectric film 133, and the fourth dielectric film 134 is one unit, and such a laminate is repeatedly stacked with the spacer dielectric film 136 interposed between adjacent laminates, so that three units of laminates are stacked.

Also, a first source/drain 104 and a second source/drain 105 are formed as n-type diffusion layers to a predetermined thickness from a surface in the silicon substrate 101 to be located at both sides of the gate electrode 103. The channel forming region 106 is formed between the first source/drain 104 and the second source/drain 105. Also, although an n-channel MOS device is exemplarily explained in the present embodiment, a p-channel MOS device may be used. Accordingly, the following content about the present embodiment may be applied to both an n-channel MOS device and a p-channel MOS device.

In the MOS memory device 603 according to the present embodiment, the first dielectric film 131, the fifth dielectric film 135, and the gate electrode 103 have the same configurations as the first dielectric film 111, the fifth dielectric film 115, and the gate electrode 103 of the MOS memory device 601 of FIG. 6, and thus an explanation thereof will not be given.

The second dielectric film is a silicon nitride film (SiN film) formed on the first dielectric film 131. The second dielectric film 132 has an energy band-gap of, for example, 2.5 to 4 eV. A thickness of the second dielectric film 132 is preferably in a range of, for example, 2 nm to 20 nm, and more preferably in a range of 3 nm to 5 nm.

The third dielectric film 133 is a silicon nitride film (SiN film) formed on the second dielectric film 132. The third dielectric film 133 has an energy band-gap of, for example, 5 to 7 eV. A thickness of the third dielectric film 133 is preferably in a range of, for example, 2 nm to 30 nm, and more preferably in a range of 4 nm to 10 nm.

The fourth dielectric film 134 is a silicon nitride film (SiN film) formed on the third dielectric film 133. The fourth dielectric film 134 has the same energy band-gap and the same thickness as those of the second dielectric film 132.

The spacer dielectric film 136 is a silicon nitride film (SiN film) formed on the fourth dielectric film 134. In the present embodiment, the same film as the third dielectric film 133 may be used as the spacer dielectric film 136. That is, the spacer dielectric film 136 has an energy band-gap of, for example, 5 to 7 eV. Also, a thickness of the spacer dielectric film 136 is preferably in a range of, for example, 2 nm to 30 nm, and more preferably in a range of 4 nm to 10 nm.

Also, as shown in FIG. 12, the MOS memory device 603 has an energy band structure in which band-gaps 131a and 135a of the first dielectric film 131 and the fifth dielectric film 135 are larger than band-gaps 132a, 133a, 134a, and 136a of the second dielectric film 132, the third dielectric film 133, the fourth dielectric film 134 which constitute an intermediate laminate interposed between the first dielectric film 131 and the fifth dielectric film 135, and the spacer dielectric film 136. The band-gaps 133a and 136a of the third dielectric film 133 and the spacer dielectric film 136 are smaller than the band-gaps of the first dielectric film 131 and the fifth dielectric film 135, and larger than the band-gaps 132a and 134a of the second dielectric film 132 and the fourth dielectric film 134. Also, the second dielectric film 132 and the fourth dielectric film 134 having the smallest band-gaps are interposed adjacent to the first dielectric film 131 and the fifth dielectric film 135. Since the MOS memory device 603 has such an energy band structure, charges easily move due to tunneling effect through the first dielectric film 131 during a data write operation, thereby increasing a write operation speed and reducing a write voltage necessary to inject charges into the dielectric film laminate 102c.

In the dielectric film laminate 102c, charges tend to accumulate mainly around interfaces between the third dielectric film 133 and the second dielectric film 132 having the small band-gap between the third dielectric film 133 and the fourth dielectric film 134 having the small band-gap. Also, once charges are held in a region around the interface of the third dielectric film 133, an energy barrier is increased due to the existence of the second dielectric film 132 and the fourth dielectric film 134, thereby preventing charges from leaking out through the first dielectric film 131 or the fifth dielectric film 135. Accordingly, even though the thickness of the first dielectric film 131 or the firth dielectric film 135 is not large, charges may be stably held in the dielectric film laminate 102c, thereby achieving excellent data holding characteristics.

Accordingly, the MOS memory device 603 is a semiconductor memory device having improved data holding characteristics, increased write operation speed, reduced power consumption, and improved reliability, compared to the conventional MOS memory device.

The MOS memory device 603 may be manufactured in the same manner as that used in the first embodiment except that the dielectric film laminate 102c is formed in the following order. In the present embodiment, the second dielectric film 132, the third dielectric film 133, the fourth dielectric film 134 which play an important role as a charge accumulation region, and the spacer dielectric film 136 are formed by plasma CVD method using the plasma processing device 100. That is, the second dielectric film 132, the third dielectric film 133, and the fourth dielectric film 134 are sequentially formed on the first dielectric film 131 by plasma CVD method by using the plasma processing device 100. When the second dielectric film 132 is to be formed, plasma CVD is performed under conditions where a band-gap of the second dielectric film 132 is smaller than that of the first dielectric film 131. When the third dielectric film 133 is to be formed, plasma CVD is performed under conditions where a band-gap of the third dielectric film 133 is smaller than that of the first dielectric film 131 and larger than that of the second dielectric film 132. When the fourth dielectric film 134 is to be formed, plasma CVD is performed under conditions where a band-gap of the fourth dielectric film 134 is smaller than that of the third dielectric film 133. When the spacer dielectric film 136 is to be formed, plasma CVD is performed under conditions where a band-gap of the spacer dielectric film 136 is smaller than that of the first dielectric film 131 and larger than that of the fourth dielectric film 134. Also, in the present embodiment, dielectric films are formed under the same plasma CVD conditions so that the second dielectric film 132 and the fourth dielectric film 134 have the same band-gaps and the third dielectric film 133 and the spacer dielectric film 136 have the same band-gaps. However, the magnitude of the band-gaps 132a and 134a, or the band-gap 133a and the band-gap 136 may be the same as or different from each other. A magnitude of a band-gap may be controlled by changing only pressure conditions of plasma CVD processing as described above. A laminate of the second dielectric film 132, the third dielectric film 133, and the fourth dielectric film 134 formed in this way is one unit, and such a laminate is repeatedly stacked with the spacer dielectric film 136 interposed between adjacent laminates, thereby forming the insulting film laminate 102c.

Also, although the laminate of the second dielectric film 132, the third dielectric film 133, and the fourth dielectric film 134 is one unit and such a laminate is repeatedly stacked three times in the MOS memory device 603 of FIG. 11, the number of times the laminate is repeatedly stacked may be 2, or 4 or more. Also, although the laminate of the second dielectric film 132, the third dielectric film 133, and the fourth dielectric film 134 is repeatedly stacked with the spacer dielectric film 136 interposed between adjacent laminates in the present embodiment, the spacer dielectric film 136 may not be formed.

Also, in the MOS memory device 603 of FIG. 11, the order of magnitudes of band-gaps may be reversed by applying the pressures in a reverse order of the pressures applied when the second dielectric film 132, the third dielectric film 133, the fourth dielectric film 134, and the spacer dielectric film 136 are formed. An energy band structure in this case is shown in FIG. 13. Since the MOS memory device 603 has such an energy band structure, charges easily move due to tunneling effect through the first dielectric film 131 during a data write operation, thereby increasing a write operation speed and reducing a write voltage necessary to inject charges into the dielectric film laminate 102c. Also, since charges tend to accumulate mainly on a region around the third dielectric film 133, even though a thickness of the first dielectric film 131 or the fifth dielectric film 135 is not large, charges may be stably held in the dielectric film laminate 102c, thereby achieving excellent data holding characteristics.

Write, read, and erase operations of the MOS memory device 603 according to the present embodiment may be performed in the same manner as those in the first embodiment.

Figure 14:
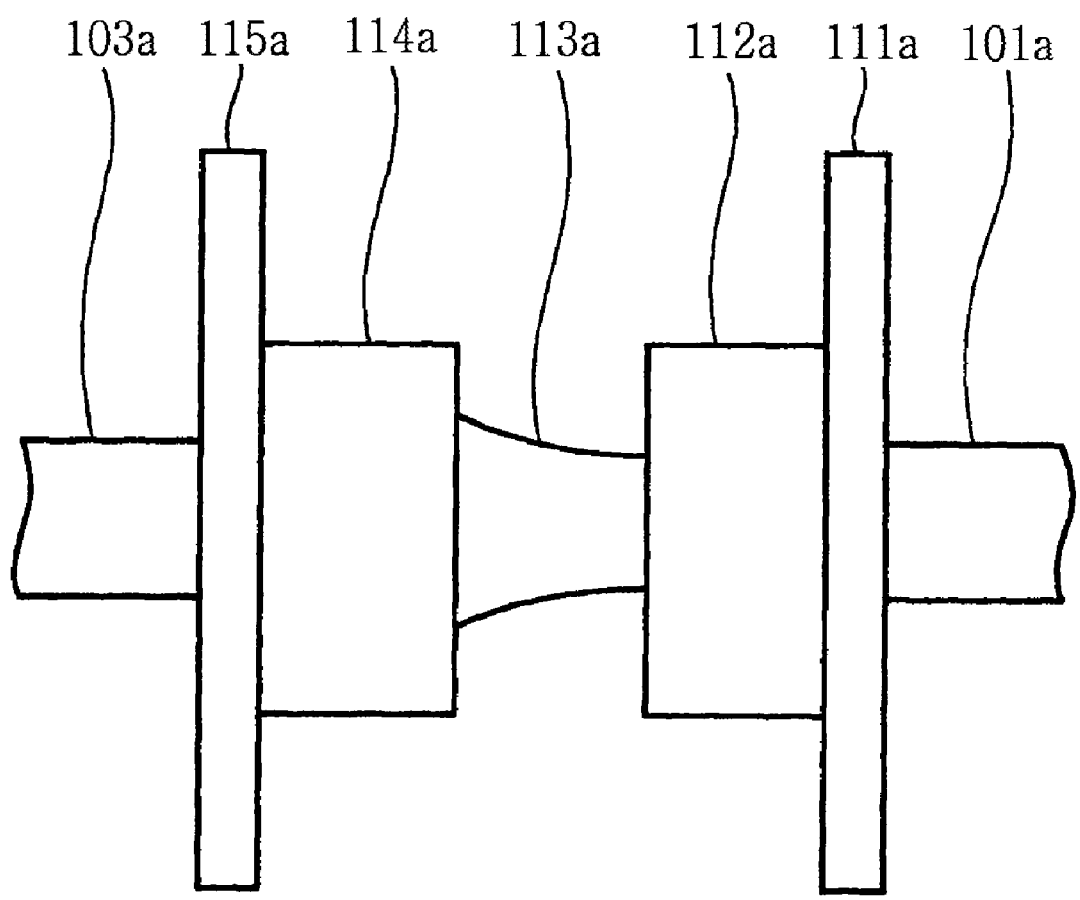
FIG. 14 shows a modified example of the MOS memory device of FIG. 6.

Also, when plasma CVD is performed by using the plasma processing device 100, a processing pressure of plasma CVD may be gradually changed while one layer of dielectric film is formed. For example, in a process of manufacturing the MOS memory device 601 of FIG. 6 according to the first embodiment, the MOS memory device having the energy band structure, for example, as shown in FIG. 14 may be formed by, for example, gradually increasing or decreasing a processing pressure while maintaining a flow rate of a silane-based gas, as shown in FIG. 4, or, for example, gradually increasing or decreasing a flow rate of a silane-based gas while maintaining a processing pressure, as shown in FIG. 5, when the third dielectric film 113 is formed. In this case, it is preferable that thicknesses of silicon nitride films formed in each step of applying processing pressures or flow rates are the same. FIG. 14 shows an example where, in a process of forming the third dielectric film 113, a processing pressure is changed to gradually increase the band-gap 113a. Also, unlike in FIG. 14, it is possible that in a process of forming the third dielectric film 113, the band-gap 113a may be gradually reduced.

While the embodiments of the present invention have been described, the present invention is not limited to the embodiments and various modifications can be made. For example, although an n-channel MOS memory device is exemplarily explained in each of the above embodiments, a p-channel semiconductor memory device may be used by inverting a conductivity type of impurities.

Also, although a band-gap of a silicon nitride film is changed by changing a processing pressure of plasma CVD processing in the above embodiments, the method of the present invention is not limited to a case of manufacturing a MOS memory device including a laminate of silicon nitride films as dielectric films, and the method of the present invention can be applied to a case of manufacturing a MOS memory device including a dielectric film laminate of, for example, metal oxide films, in particular, high-κ dielectric metal oxide films. Also, as high-κ dielectric metal oxides, $HfO_2$, Hf—Si—O, Hf—Al—O, $ZrO_2$, $Al_2O_3$, PZT [$Pb(Zr,Ti)O_3$ (lead zirconate titanate], BST [$(Ba,Sr)TiO_3$], SRO ($SrRuO_3$) SBT ($SrBi_2Ta_2O_9$; strontium bismuth tantalate), $Ta_2O_5$ (tantalum pentoxide)$BaTiO_3$(barium titanate), $TiO_2$, YSZ (Yttria-stabilized zirconia), BIT ($Bi_4Ti_3O_{12}$), STO ($SrTiO_3$), zirconium silicon complex oxide, $La_2O_3$, $CeO_2$, $Na_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $La_2O_3$, $Pr_2O_3$, $Pr_6O_{11}$, ZrON (zirconium oxynitride), and the like may be used.

The invention claimed is:

1. A method for forming a MOS memory device having a dielectric film laminate, in which dielectric films are stacked, as a charge accumulation region between a semiconductor layer and a gate electrode, the method comprising:
    forming the dielectric film laminate by sequentially forming the dielectric films in such a way that magnitudes of band-gaps of adjacent dielectric films constituting the dielectric film laminate are different from each other,
    wherein the dielectric films are sequentially formed using a plasma formed from one or more material gases under processing pressures, the processing pressures used for forming the adjacent dielectric films being different from each other to obtain the different magnitude of band-gaps.

2. The method of claim 1, wherein in the forming of the dielectric film laminate, an ammonia gas and a silicon-containing compound gas are used as the one or more material gases, and
    wherein the forming of the dielectric film laminate comprises:
    forming a first silicon nitride film having a first band-gap by performing plasma CVD under a first processing pressure which is in a range from 1 Pa to 1333 Pa; and
    forming a second silicon nitride film having a second band-gap that is larger or smaller than the first band-gap, by performing plasma CVD under a second pressure which is in a range from 1 Pa to 1333 Pa and is different from the first processing pressure.

3. The method of claim 1, wherein in the forming of the dielectric film laminate, a nitrogen gas and a silicon-containing compound gas are used as the one or more material gases, and
    wherein the forming of the dielectric film laminate comprises:
    forming a first silicon nitride film having a first band-gap by performing plasma CVD under a first processing pressure which is in a range from 1 Pa to 1333 Pa; and
    forming a second silicon nitride film having a second band-gap that is larger or smaller than the first band-gap, by performing plasma CVD under a second processing pressure which is in a range from 1 Pa to 1333 Pa and is different from the first processing pressure.

4. The method of claim 1, wherein the forming of the dielectric film laminate comprises:
    forming a first dielectric film having a first band-gap at a position closest to the semiconductor layer;
    forming a second dielectric film having a second band-gap that is smaller than that of the first dielectric film;
    forming a third dielectric film having a third band-gap that is larger than that of the second dielectric film;
    forming a fourth dielectric film having a fourth band-gap that is smaller than that of the third dielectric film; and
    forming a fifth dielectric film having a fifth band-gap, which is larger than that of the fourth dielectric film, at a position closest to the gate electrode.

5. The method of claim 4, wherein silicon oxide films are formed as the first dielectric film and the fifth dielectric film, and silicon nitride films are formed as the second dielectric film, the third dielectric film, and the fourth dielectric film.

6. The method of claim 4, wherein an intermediate laminate comprising the second dielectric film, the third dielectric film, and the fourth dielectric film is repeatedly formed between the first dielectric film and the fifth dielectric film.

7. The method of claim 1, wherein the forming of the dielectric film laminate comprises:
    forming a first dielectric film having a first band-gap at a position closest to the semiconductor layer;
    forming a second dielectric film having a second band-gap that is smaller than that of the first dielectric film;
    forming a third dielectric film having a third band-gap that is smaller than that of the second dielectric film;
    forming a fourth dielectric film having a fourth band-gap that is larger than that of the third dielectric film; and
    forming a fifth dielectric film having a fifth band-gap, which is larger than that of the fourth dielectric film, at a position closest to the gate electrode.

8. The method of claim 7, wherein, in the forming of the third dielectric film, the MOS memory device has an energy band structure in which, in a film thickness direction from a semiconductor layer side to a gate electrode side, band-gaps are gradually increased or decreased from a vicinity of an interface between the second dielectric film and the third dielectric film toward a vicinity of an interface between the fourth dielectric film and the third dielectric film.

9. The method of claim 7, wherein an intermediate laminate comprising the second dielectric film, the third dielectric film, and the fourth dielectric film is repeatedly formed between the first dielectric film and the fifth dielectric film.

10. The method of claim 7, wherein silicon oxide films are formed as the first dielectric film and the fifth dielectric film, and silicon nitride films are formed as the second dielectric film, the third dielectric film, and the fourth dielectric film.

* * * * *